(12) United States Patent
Takamatsu et al.

(10) Patent No.: US 8,652,854 B2
(45) Date of Patent: Feb. 18, 2014

(54) MANUFACTURING METHOD OF A SEMICONDUCTOR DEVICE

(75) Inventors: Tomohiro Takamatsu, Kawasaki (JP); Junichi Watanabe, Kawasaki (JP); Ko Nakamura, Kawasaki (JP); Wensheng Wang, Kawasaki (JP); Naoyuki Sato, Yokohama (JP); Aki Dote, Kawasaki (JP); Kenji Nomura, Kawasaki (JP); Yoshimasa Horii, Kawasaki (JP); Masaki Kurasawa, Kawasaki (JP); Kazuaki Takai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 108 days.

(21) Appl. No.: 13/417,811

(22) Filed: Mar. 12, 2012

(65) Prior Publication Data
US 2012/0171785 A1 Jul. 5, 2012

Related U.S. Application Data

(62) Division of application No. 12/453,451, filed on May 12, 2009, now Pat. No. 8,153,448, which is a division of application No. 10/695,643, filed on Oct. 29, 2003, now Pat. No. 7,547,933.

(30) Foreign Application Priority Data

Oct. 30, 2002 (JP) .................................. 2002-316733

(51) Int. Cl.
H01L 21/00 (2006.01)
(52) U.S. Cl.
USPC ................................ 438/3; 438/256; 438/396

(58) Field of Classification Search
USPC .............................................. 438/396, 256, 3
See application file for complete search history.

(56) References Cited

U.S. PATENT DOCUMENTS

| 4,110,254 | A | * | 8/1978 | Lauder | 502/303 |
| 5,719,417 | A | * | 2/1998 | Roeder et al. | 257/295 |
| 5,824,429 | A | * | 10/1998 | Das et al. | 429/484 |
| 6,060,735 | A | * | 5/2000 | Izuha et al. | 257/295 |
| 6,139,971 | A | * | 10/2000 | Bruchhaus et al. | 428/446 |
| 6,239,457 | B1 | * | 5/2001 | Suenaga et al. | 257/295 |

(Continued)

FOREIGN PATENT DOCUMENTS

| EP | 11-70797 A2 | 1/2002 |
| JP | 11-274429 A | 10/1999 |

(Continued)

OTHER PUBLICATIONS

European Search Report dated Jan. 29, 2010, issued in corresponding European Patent Application No. 09177096.

(Continued)

Primary Examiner — Laura Menz
(74) Attorney, Agent, or Firm — Westerman, Hattori, Daniels & Adrian, LLP

(57) ABSTRACT

There are provided a capacitor lower electrode formed on an adhesive layer, whose surface roughness is 0.79 nm or less, and having a (111) orientation that is inclined from a perpendicular direction to an upper surface of a substrate by 2.3° or less, a ferroelectric layer having a structure the (111) orientation of which is inclined from the perpendicular direction to the upper surface of the substrate by 3.5° or less, and a capacitor upper electrode.

3 Claims, 30 Drawing Sheets

(56) References Cited

U.S. PATENT DOCUMENTS

| | | | |
|---|---|---|---|
| 6,407,422 B1* | 6/2002 | Asano et al. | 257/306 |
| 6,462,931 B1* | 10/2002 | Tang et al. | 361/305 |
| 6,611,014 B1* | 8/2003 | Kanaya et al. | 257/295 |
| 6,617,178 B1* | 9/2003 | Aggarwal et al. | 438/16 |
| 6,737,694 B2* | 5/2004 | Kim et al. | 257/296 |
| 6,946,340 B2* | 9/2005 | Kweon | 438/240 |
| 6,974,985 B2* | 12/2005 | Kurasawa et al. | 257/296 |
| 6,982,453 B2* | 1/2006 | Kanaya et al. | 257/306 |
| 7,029,984 B2* | 4/2006 | Horii et al. | 438/396 |
| 7,153,706 B2* | 12/2006 | Aggarwal et al. | 438/3 |
| 7,176,132 B2* | 2/2007 | Sashida et al. | 438/677 |
| 7,221,015 B2* | 5/2007 | Ando et al. | 257/306 |
| 7,518,173 B2* | 4/2009 | Hikosaka et al. | 257/295 |
| 7,547,933 B2* | 6/2009 | Takamatsu et al. | 257/295 |
| 7,897,413 B2* | 3/2011 | Wang et al. | 438/3 |
| 7,960,228 B2* | 6/2011 | Wang et al. | 438/256 |
| 7,964,904 B2* | 6/2011 | Wang | 257/295 |
| 8,153,448 B2* | 4/2012 | Takamatsu et al. | 438/3 |
| 8,357,585 B2* | 1/2013 | Wang | 438/396 |
| 8,497,181 B1* | 7/2013 | Wang | 438/396 |
| 2001/0051381 A1* | 12/2001 | Yang et al. | 438/3 |
| 2002/0021546 A1* | 2/2002 | Nakamura | 361/305 |
| 2002/0048824 A1* | 4/2002 | Carr et al. | 438/3 |
| 2002/0061603 A1* | 5/2002 | Eto | 438/3 |
| 2002/0074601 A1* | 6/2002 | Fox et al. | 257/350 |
| 2002/0168817 A1* | 11/2002 | Kweon | 438/238 |
| 2003/0021079 A1* | 1/2003 | Natori et al. | 361/302 |
| 2003/0057464 A1* | 3/2003 | Nam | 257/295 |
| 2003/0227046 A1* | 12/2003 | Ando et al. | 257/310 |
| 2004/0113189 A1* | 6/2004 | Takamatsu et al. | 257/295 |
| 2004/0166596 A1* | 8/2004 | Sashida et al. | 438/3 |
| 2005/0215006 A1* | 9/2005 | Horii et al. | 438/240 |
| 2007/0020799 A1* | 1/2007 | Choi et al. | 438/103 |
| 2007/0114590 A1* | 5/2007 | Ando et al. | 257/306 |
| 2008/0073682 A1* | 3/2008 | Kumura et al. | 257/295 |
| 2008/0111172 A1* | 5/2008 | Wang et al. | 257/295 |
| 2008/0211880 A1* | 9/2008 | Hara et al. | 347/70 |
| 2008/0259133 A1* | 10/2008 | Hara et al. | 347/70 |
| 2008/0261332 A1* | 10/2008 | Wang et al. | 438/3 |
| 2009/0020797 A1* | 1/2009 | Wang | 257/295 |
| 2009/0127603 A1* | 5/2009 | Yamakawa et al. | 257/295 |
| 2009/0280577 A1* | 11/2009 | Takamatsu et al. | 438/3 |
| 2011/0024875 A1* | 2/2011 | Takebayashi et al. | 257/532 |
| 2011/0204479 A1* | 8/2011 | Wang et al. | 257/532 |
| 2011/0217792 A1* | 9/2011 | Wang | 438/3 |
| 2012/0171785 A1* | 7/2012 | Takamatsu et al. | 438/3 |
| 2013/0178038 A1* | 7/2013 | Wang | 438/381 |

FOREIGN PATENT DOCUMENTS

| | | |
|---|---|---|
| JP | 2001-036026 A | 2/2001 |
| JP | 2001-85624 A | 3/2001 |
| JP | 2002-064186 A | 2/2002 |
| JP | 2002-231901 A | 8/2002 |
| WO | 98-05062 A1 | 2/1998 |

OTHER PUBLICATIONS

European Search Report dated Jan. 19, 2007, issued in corresponding European Patent Application No. 03256883.

European Search Report dated Nov. 9, 2006, issued in corresponding European Patent Application No. 03256883.

Japanese Office Action dated Jun. 25, 2009, issued in Japanese Application No. 2002-316733.

Vente, F. Jaap et al., "Structural Chemistry and Electronic Properties of the Hexagonal Perovskites Ba$_{1-x}$Co$_x$O$_3$-d (x=0.5, 0.7, 0.8)", Journal of Solid State Chemistry 152, 2000, pp. 361-373.

* cited by examiner

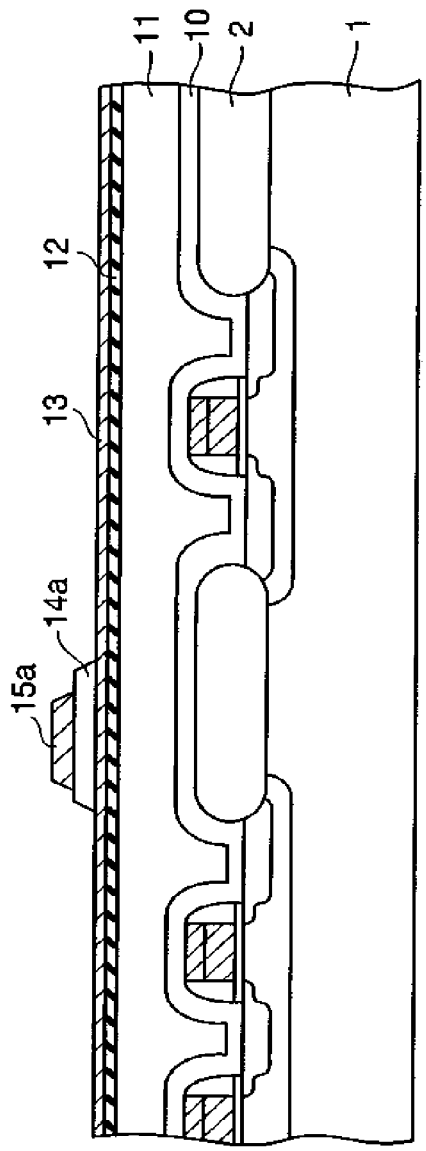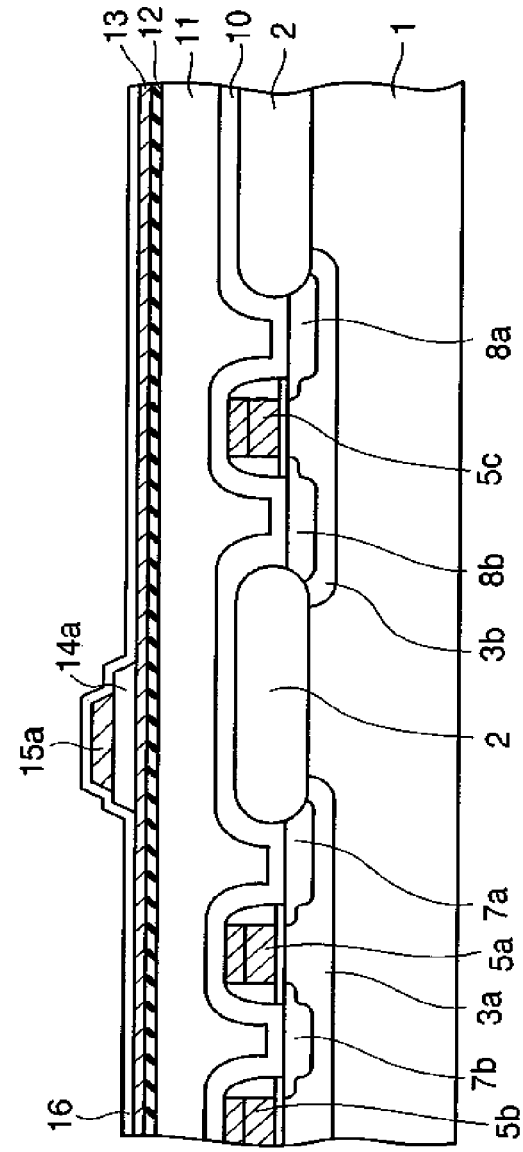

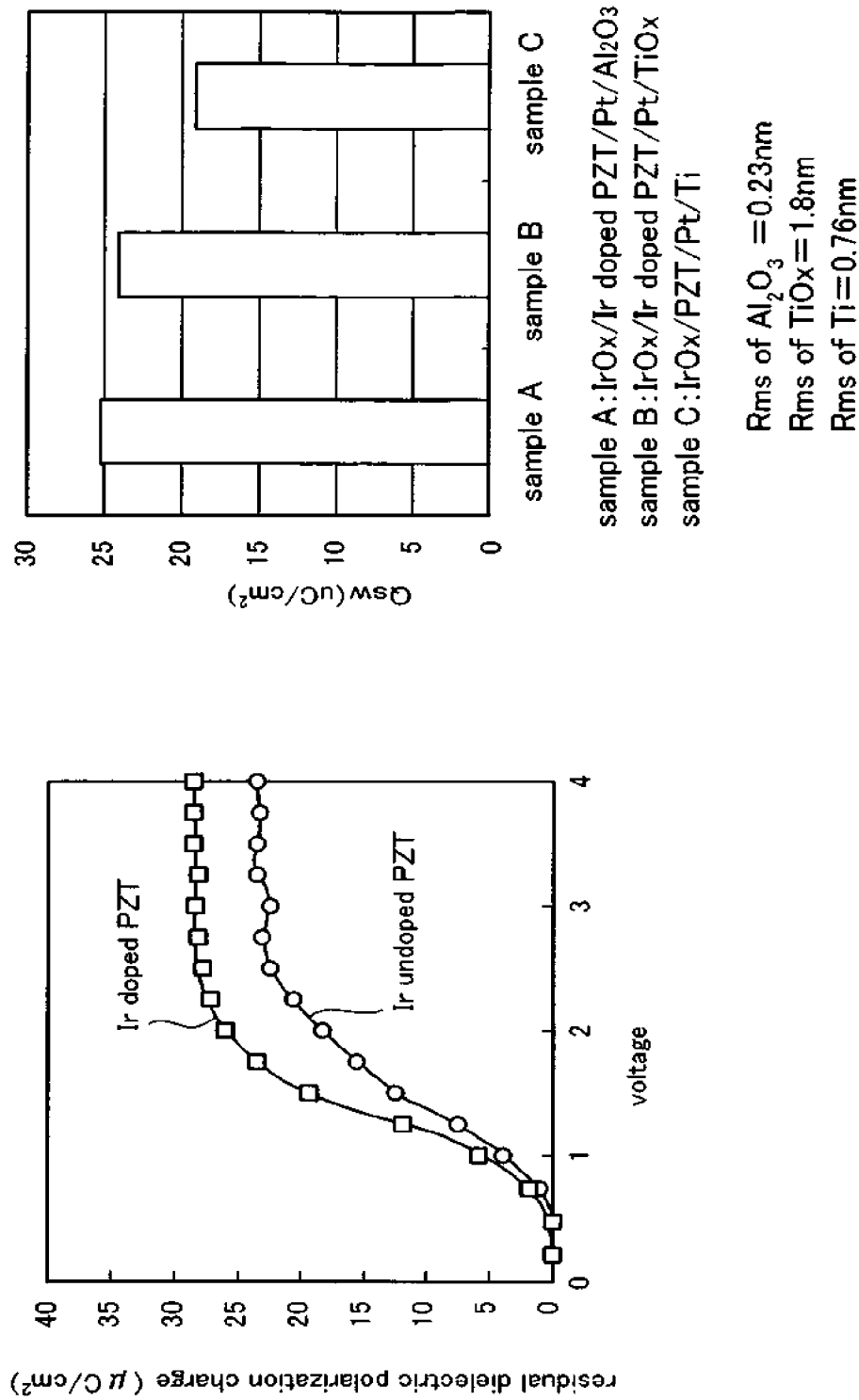

MANUFACTURING METHOD OF A SEMICONDUCTOR DEVICE

CROSS-REFERENCE TO RELATED APPLICATIONS

This application is a divisional of application Ser. No. 12/453,451, filed May 12, 2009, which is a divisional of application Ser. No. 10/695,643, filed Oct. 29, 2003, now U.S. Pat. No. 7,547,933 and is based upon and claims priority of Japanese Patent Application No. 2002-316733, filed on Oct. 30, 2002, the contents being incorporated herein by reference.

BACKGROUND OF THE INVENTION

1. Field of the Invention

The present invention relates to a semiconductor device and a manufacturing method of a semiconductor device and, more particularly, to a semiconductor device having a ferroelectric capacitor and a method of manufacturing the same.

2. Description of the Related Art

As the nonvolatile memory that can store the information after a power supply is turned OFF, the flash memory and the ferroelectric memory (FeRAM) are known.

The flash memory has the floating gate that is buried in the gate insulating film of the insulated-gate field effect transistor (IGFET), and stores the information by accumulating the charge representing the stored information in the floating gate. In order to write/erase the information, a tunnel current that passes through the gate insulating film must be supplied, and thus a relatively high voltage is required.

The FeRAM has the ferroelectric capacitor that stores the information by utilizing the hysteresis characteristic of the ferroelectric substance. In the ferroelectric capacitor, the ferroelectric film formed between the upper electrode and the lower electrode generates the polarization in response to the voltage applied between the upper electrode and the lower electrode, and has the spontaneous polarization that maintains the polarization even after the applied voltage is removed.

If the polarity of the applied voltage is inverted, the polarity of the spontaneous polarization is also inverted. The information can be read out by sensing the polarity and the magnitude of the spontaneous polarization. The FeRAM has such an advantage that such FeRAM can operate at a lower voltage than the flash memory and can perform the high-speed writing with low power consumption.

The capacitor employed in the memory cell of the FeRAM has such a structure that, as set forth in following Patent Literatures 1 to 3, the PZT film, for example, is employed as the ferroelectric film and also the ferroelectric film is put between the upper electrode and the lower electrode. The platinum film, for example, is employed as the lower electrode, and also the platinum film, the iridium oxide film, or the like, for example, is employed as the upper electrode.

In Patent Literature 1, the oxidized titanium adhesive layer is formed on the thermal oxide film that covers the CMOS integrated circuit wafer, and the platinum lower electrode layer, the PZT ferroelectric film, and the iridium upper electrode layer are formed sequentially on the titanium adhesive layer.

In Patent Literature 2, it is described that the $Si_3N_4$ surface layer, the $Al_2O_3$ intermediate layer, the platinum layer, and the PZT ferroelectric layer are formed sequentially on the silicon wafer. According to this, it is concluded that the PZT ferroelectric layer, which has the uniform layer structural body rather than the case where the material containing the titanium is employed as the intermediate layer, can be formed.

In this case, the $Al_2O_3$ intermediate layer is formed at the temperature of 100 to 300° C. by the sputtering.

In Patent Literature 3, it is described that the ferroelectric capacitor constructed by sequentially forming the first hydrogen barrier film, the Pt lower electrode film, the PZT film, the Pt upper electrode film, and the second hydrogen barrier film is formed on the insulating film, whereby the characteristic deterioration of the ferroelectric capacitor can be suppressed. Also, it is described that, as the hydrogen barrier film, at least one type is selected from meta oxides consisting of aluminum oxide ($Al_2O_3$), $Al_xO_y$, AlN, WN, $SrRuO_3$, $IrO_x$, $RuO_x$, $ReO_x$, $OsO_x$, $MgO_x$, $ZrO_x$, etc.

[Patent Literature 1]
Specification of US Patent Application Publication 2002/0074601

[Patent Literature 2]
Pamphlet of International Publication No. 98/05062

[Patent Literature 3]
Patent Application Publication (KOKAI) 2001-36026

Although the underlying film made of either the titanium-containing material film or the metal oxide is formed under the lower electrode in above Patent Literatures 1 to 3, this method cannot sufficiently improve the characteristic of the ferroelectric capacitor and cannot suppress variation in the performances of the memory cells of the same chip.

SUMMARY OF THE INVENTION

It is an object of the present invention to provide a semiconductor device capable of further improving characteristics of a ferroelectric capacitor compared to the prior art and a manufacturing method of a semiconductor.

According to an aspect of the present invention, there is provided a semiconductor device that comprises an insulating film formed over a semiconductor substrate; an adhesive layer formed on the insulating film; a capacitor lower electrode formed on the adhesive layer; a ferroelectric layer formed on the capacitor lower electrode; and a capacitor upper electrode formed on the ferroelectric layer, wherein the ferroelectric layer has an $ABO_3$ perovskite structure that contains Ir in at least one of an A site and a B site (A=any of Bi, Pb, Ba, Sr, Ca, Na, K, and a rare earth element, B=any of Ti, Zr, Nb, Ta, W, Mn, Fe, Co, and Cr), a surface roughness of the adhesive layer is 0.79 nm or less, and the capacitor lower electrode is inclined from a perpendicular direction of an upper surface of the semiconductor substrate by 2.3° or less, or the ferroelectric layer has the $ABO_3$ perovskite structure having a (111) orientation that is inclined from the perpendicular direction of the upper surface of the semiconductor substrate by 3.5° or less.

Also, according to another aspect of the present invention, there is provided a manufacturing method of a semiconductor device that comprises the steps of forming an insulating film over a semiconductor substrate; forming an adhesive layer on the insulating film; forming a first conductive film on the adhesive layer; forming a ferroelectric layer on the first conductive film; forming a second conductive film on the ferroelectric layer; forming a capacitor upper electrode by patterning the second conductive film; leaving the ferroelectric layer at least under the upper electrode by patterning the ferroelectric layer; and forming a capacitor lower electrode below the upper electrode by patterning the first conductive film;

wherein a surface roughness of the adhesive layer is formed smaller than 0.79 nm or less and a (111) orientation of the first conductive film is formed to incline from a perpendicular direction of an upper surface of the semiconductor substrate by 2.3° or less, the ferroelectric layer is formed to have an $ABO_3$ perovskite structure that contains Ir in at least one of an A site and a B site (A=any of Bi, Pb, Ba, Sr, Ca, Na, K, and a rare earth element, B=any of Ti, Zr, Nb, Ta, W, Mn, Fe, Co, and Cr), or a surface roughness of the adhesive layer is 0.79 nm or less, the first conductive film is formed of iridium or iridium-containing material, and the ferroelectric layer is formed by the MOCVD method such that grains having the (111) orientation are contained in excess of 90% or more.

According to the present invention, the capacitor including the ferroelectric layer having the $ABO_3$ perovskite structure having Ir in at least one of the A site and the B site is provided. Therefore, the residual polarization characteristic of this capacitor can be increased compared to the residual polarization characteristic of the capacitor including the ferroelectric layer that does not have Ir in the $ABO_3$ perovskite structure.

Also, the capacitor lower electrode, the (111) orientation of which is inclined from the perpendicular direction of the substrate surface by 2.3° or less, is formed on the adhesive layer whose surface roughness is smaller than 0.79 nm or less. Therefore, the (111) orientation of the ferroelectric layer that is formed on the capacitor lower electrode can be improved.

In addition, the (111) orientation of the ferroelectric layer formed on the lower electrode of the capacitor is inclined from the perpendicular direction of the substrate surface by 3.5° or less. Therefore, the number of failure bit in the FeRAM having such capacitor can be reduced smaller than the prior art.

Further, when the lower electrode made of iridium or iridium-containing material is formed on the adhesive layer whose surface roughness is smaller than 0.79 nm or less and then the ferroelectric layer is formed thereon by the MOCVD method, it is possible to form the ferroelectric layer that contains the grains having the (111) orientation by 90% or more. In this case, it is preferable to set the growth temperature (substrate temperature) of the ferroelectric layer to 600 to 650° C.

It should be noted that when the capacitor is the stacked type, there arises concern about oxidation of conductive plug formed directly under the capacitor, due to the above temperature range employed for forming the ferroelectric layer. In this case, the conductive plug can be prevented from being oxidized by employing a structure in which the conductive plug is covered with an oxygen barrier metal layer.

BRIEF DESCRIPTION OF THE DRAWINGS

FIGS. 1A to 1I are sectional views showing steps of manufacturing a semiconductor device according to a first embodiment of the present invention;

FIG. 10 is a view showing measured results about $Q_{SW}$ of the capacitor having the Ir-doped PZT and $Q_{SW}$ of the capacitor having the Ir-undoped PZT;

FIG. 11 is a view showing a voltage-residual dielectric polarization charge characteristic of the capacitor according to the first embodiment of the present invention;

DETAILED DESCRIPTION OF THE PREFERRED EMBODIMENTS

Embodiments of the present invention will be explained with reference to the drawings hereinafter.

(First Embodiment)

FIGS. 1A to 1I are sectional views showing steps of forming a semiconductor memory device according to a first embodiment of the present invention.

Figure 1A:
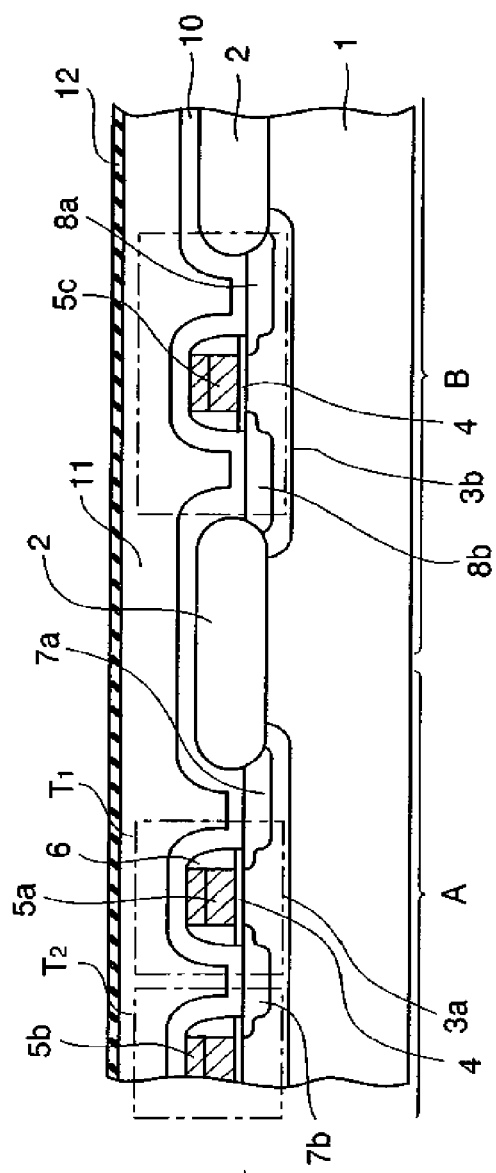

First, steps required until a sectional structure shown in FIG. 1A is formed will be explained hereunder.

In FIG. 1A, an element isolation insulating film 2 is formed on a surface of a p-type silicon (semiconductor) substrate 1 by the LOCOS (Local Oxidation of Silicon) method. In this case, the STI (Shallow Trench Isolation) structure may be employed as the element isolation insulating film 2.

After the element isolation insulating film 2 is formed, a p-type impurity and an n-type impurity are introduced selectively into predetermined active regions (transistor forming regions) of a memory cell region A and a peripheral circuit region B of the silicon substrate 1 respectively. Thus, a p-well 3a is formed in the active region of the memory cell region A whereas an n-well 3b is formed in the active region of the peripheral circuit region B.

In this case, in FIGS. 1A to 1I, a part of the p-well 3a is omitted from illustration. Also, a p-well (not shown) is formed in the peripheral circuit region B to form a CMOS.

Then, the surface of the silicon substrate 1 is thermally oxidized. Thus, a silicon oxide film used as a gate insulating film 4 on respective surfaces of the p-well 3a and the n-well 3b is formed.

Then, a polysilicon or amorphous silicon film and a tungsten silicide film are formed sequentially on the element isolation insulating film 2 and the gate insulating films 4. Then, the silicon film and the tungsten silicide film are patterned into predetermined shapes by the photolithography method. Thus, gate electrodes 5a, 5b are formed on the p-well 3a, and also a gate electrode 5c is formed on the n-well 3b. In this case, one gate electrode 5c formed on the p-well 3a is omitted from illustration.

In the memory cell region A, two gate electrodes 5a, 5b are formed at a distance on the p-well 3a in almost parallel with each other. These gate electrodes 5a, 5b are extended onto the element isolation insulating film 2 to serve as the word line.

Then, the n-type impurity is ion-implanted into one p-well 3a in the memory cell region A on both sides of the gate electrodes 5a, 5b. Thus, first and second n-type impurity diffusion regions 7a, 7b and a third n-type impurity diffusion region (not shown) serving as the source/drain of n-channel MOS transistors $T_1$, $T_2$ are formed. The second n-type impurity diffusion region 7b that is positioned in the middle of the p-well 3a is connected electrically to the bit line described later. Also, the first n-type impurity diffusion region 7a and the third n-type impurity diffusion region, which are positioned on both sides of the p-well 3a, are connected electrically to the ferroelectric capacitor described later.

Then, the p-type impurity is ion-implanted into the n-well 3b in the peripheral circuit region B on both sides of the gate electrode 5c. Thus, first and second p-type impurity diffusion regions 8a, 8b serving as the source/drain of a p-channel MOS transistor $T_3$ are formed.

Then, an insulating film is formed on the silicon substrate 1, the element isolation insulating film 2, and the gate electrodes 5a, 5b, 5c. Then, sidewall insulating films 6 are left on both side portions of the gate electrodes 5a to 5c by etching back the insulating film. As the insulating film, a silicon oxide ($SiO_2$) film formed by the CVD method, for example, is used.

Then, while using the gate electrodes 5a, 5b and the sidewall insulating films 6 on the p-well 3a as a mask, the n-type impurity is ion-implanted into the first and second n-type impurity diffusion regions 7a, 7b and the third n-type impurity diffusion region. Thus, the n-type impurity diffusion regions are formed as the LDD structure. Also, while using the gate electrode 5c and the sidewall insulating films 6 on the p-well 3a as a mask, the p-type impurity is ion-implanted into the p-type impurity diffusion regions 8a, 8b. Thus, the p-type impurity diffusion regions 8a, 8b are formed as the LDD structure.

In this case, individual ion-implantations of the n-type impurity and the p-type impurity are carried out by using resist patterns (not shown).

As a consequence, formation of the first re-channel MOS transistor $T_1$ having the first and second n-type impurity diffusion regions 7a, 7b and the gate electrode 5a and formation of the second n-channel MOS transistor $T_2$ having the second n-type impurity diffusion region 7b and the third n-type impurity diffusion region and the gate electrode 5b are completed. Also, formation of the p-channel MOS transistor $T_3$ having the first and second p-type impurity diffusion regions 8a, 8b and the gate electrode 5c is completed.

Then, a cover insulating film 10 for covering the n-MOS transistors $T_1$, $T_2$ and the p-MOS transistor $T_3$ is formed on the silicon substrate 1 by the plasma CVD method. As the cover insulating film 10, a silicon oxide nitride (SiON) film, for example, is formed.

Then, a silicon oxide ($SiO_2$) film of about 1.0 µm thickness is grown by the plasma CVD method using the TEOS gas. This silicon oxide film is used as a first interlayer insulating film 11.

Then, as the densifying process of the first interlayer insulating film 11, such first interlayer insulating film 11 is annealed for 30 minutes at the temperature of 650° C. in the normal-pressure nitrogen atmosphere. Then, an upper surface of the first interlayer insulating film 11 is polished by the CMP (Chemical Mechanical Polishing) method to planarize.

Then, an adhesive layer 12, whose surface roughness Rms is smaller than 0.79 nm or less, is formed on the first interlayer insulating film 11. It should be noted that the surface roughness Rms is defined as the square root of the value that is obtained by averaging the square of the deviation from an average line to a measured curve on the measured objective surface.

As the adhesive layer 12, an alumina ($Al_2O_3$) layer whose surface roughness Rms is 0.79 nm or less, for example, is formed. As the conditions applied to form the alumina layer whose surface roughness Rms is smaller than 0.79 nm or less by the sputter, a temperature of the silicon substrate 1 being put into the chamber of the sputter equipment is set to 20 to 100° C., a flow rate of an argon gas being introduced into the chamber is set to 10 to 50 sccm, the alumina is used as a target, and a power applied between the target and the substrate is set to 0.2 to 4.0 kW. A film thickness of the alumina layer having such surface roughness is, although not limited, 5 to 100 nm or, more preferably, 5 to 30 nm. In this case, the alumina layer is formed in amorphous state.

The adhesive layer 12 is a glue layer between the lower electrode, described later, and the first interlayer insulating film 11, and acts as an underlying layer of the lower electrode.

Figure 1B:
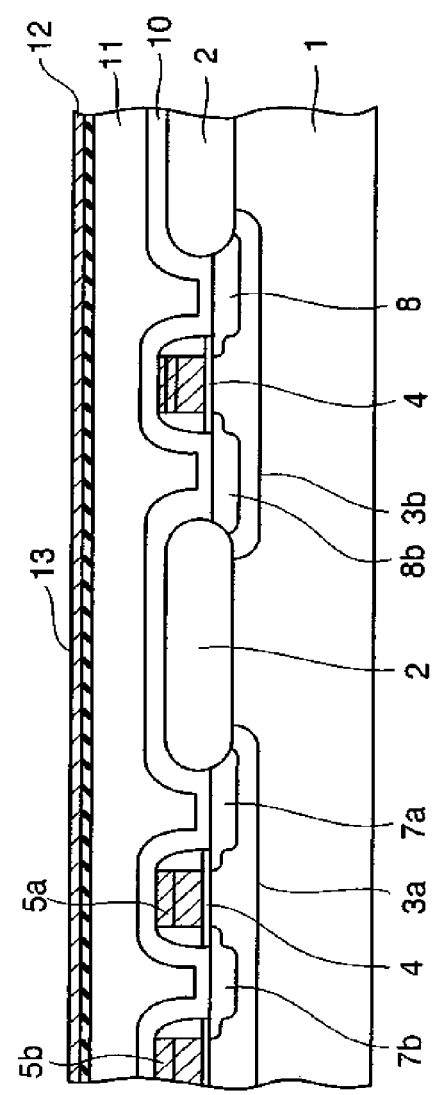

Then, as shown in FIG. 1B, a platinum (Pt) film is formed as a first conductive film 13 on the adhesive layer 12 to have a thickness of 50 to 300 nm, for example, 150 nm. As the conditions applied to form the Pt film with a thickness of 150 nm by the sputter, the temperature of the silicon substrate 1 being put into the chamber of the sputter equipment is set to about 100° C., a flow rate of the argon gas being introduced into the chamber is set to about 116 sccm, the platinum is used as the target, the power applied between the target and the substrate is set to about 1.0 kW, and a film forming time is set to about 84 second.

In this state, the (111) orientation of the crystal grain of the Pt film formed on the adhesive layer 12 is inclined by 2.3 degree or less from the perpendicular direction of the upper surface of the silicon substrate 1. It should be noted that the "orientation" used in the present and following embodiments represents the "plane orientation" that appears on an upper surface of the film or the layer.

Figure 1C:
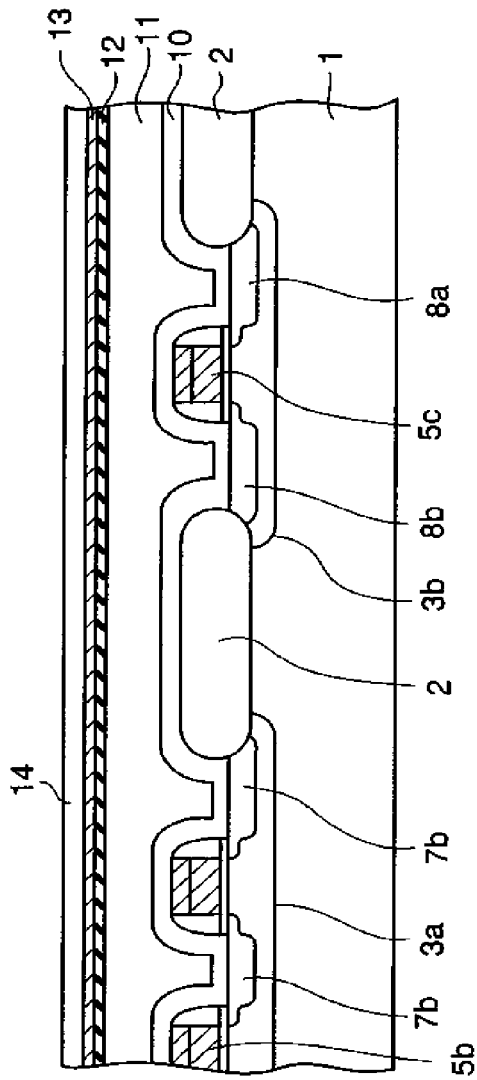

Then, as shown in FIG. 1C, a lead zirconate titanate (PZT: $Pb(Zr_{1-x}Ti_x)O_3$, 0<x<1) film is formed as a ferroelectric film 14 on the first conductive film 13 by the RF sputter method to have a thickness of 100 to 300 nm, for example, 200 nm.

As the conditions applied to form the PZT film with a thickness of 200 nm, for example, the sputter power is set to 1 kW, a flow rate of the argon gas being introduced into the chamber is set to about 20 sccm, the substrate temperature is set to 50° C., the PZT is used as the target, and the film forming time is set to 315 second.

In this case, as the forming method of the ferroelectric film 14, there are the spin-on method using the MOD (Metal Organic Deposition) solution, the MOCVD (Metal Organic CVD) method, the spin-on method using the sol-gel solution, etc. in addition to the above. Also, as the material of the ferroelectric film 14, other PZT material that contains at least one element of lanthanum (La), strontium (Sr), and calcium (Ca) in PZT, the Bi-layered structure compound such as $SrBi_2Ta_2O_9$ (SBT, Y1), $SrBi_2(Ta,Nb)_2O_9$ (SBTN, YZ), etc., and other metal oxide ferroelectric substance may be employed in addition to the PZT.

Then, as the first annealing process of the PZT film constituting the ferroelectric film 14, the RTA (Rapid Thermal Annealing) is executed at the temperature of about 585° C. for about 90 second in the oxygen atmosphere by using the rapid thermal annealing equipment. In this case, the oxygen gas and the argon gas are introduced into the oxygen atmosphere at a flow rate of 50 cc/min and a flow rate of 1.95 liter/min respectively. The PZT film is crystallized by this first PZT annealing.

Figure 1D:
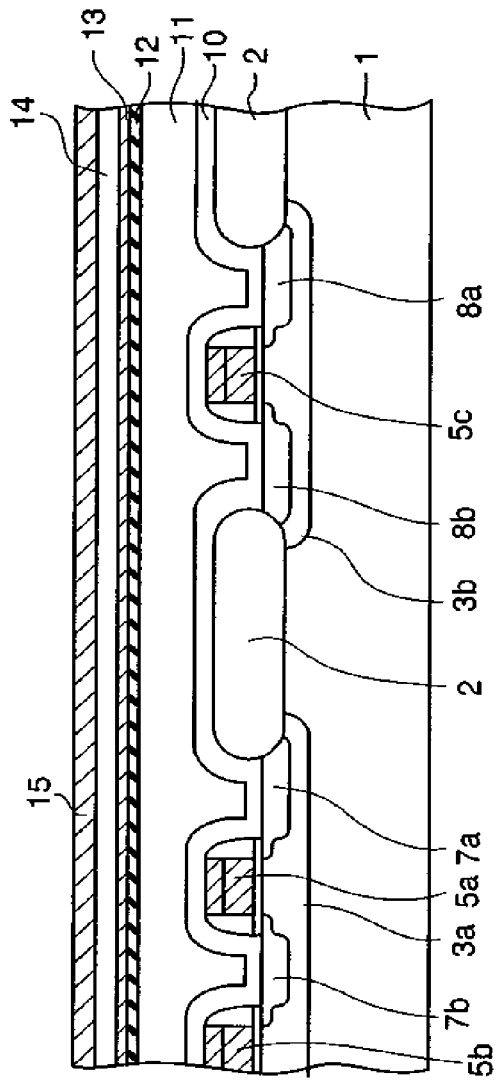

Then, as shown in FIG. 1D, an iridium oxide ($IrO_x$) film of 200 nm thickness, for example, is formed as a second conductive film 15 on the ferroelectric film 14 by the reactive sputter method.

As the conditions applied to form the $IrO_x$ film by the sputter, the temperature of the silicon substrate 1 being put into the chamber of the sputter equipment is set to about 20° C., the flow rate of the argon gas being introduced into the chamber is set to about 100 sccm, a flow rate of an oxygen ($O_2$) gas is set to 56 sccm, the iridium (Ir) is used as the target, and the power applied between the target and the substrate is set to about 2.0 kW.

Then, as the second annealing process, the RTA is applied to the ferroelectric film 14 and the $IrO_x$ film 15 for about 20 second at the temperature of about 725° c. in the oxygen atmosphere. In this case, the oxygen gas and the argon gas are introduced into the oxygen atmosphere at a flow rate of 20 cc/min and a flow rate of 2 liter/min respectively. According to this second annealing process, the iridium constituting the second conductive film 15 is doped in the PZT ferroelectric film 14. In this case, the iridium (Ir) in this ferroelectric film has a structure that a part of atoms constituting the perovskite structure of PZT except the oxygen is replaced with the iridium.

In this state, the orientation of the (111) oriented crystal grains of the PZT ferroelectric film 14 formed on the first conductive film 13 is inclined by 7° or less from the perpendicular direction of the upper surface of the silicon substrate 1.

Then, as shown in FIG. 1E, a plurality of capacitor upper electrodes 15a are formed at an interval over the element isolation insulating film 2 in the memory cell region A by patterning the second conductive film 15. Then, capacitor dielectric films 14a are formed under the capacitor upper electrodes 15a by patterning the ferroelectric film 14. The capacitor dielectric film 14a is left not only directly under the capacitor upper electrode 15a but also on its peripheral area.

Then, as shown in FIG. 1F, an alumina film of about 20 to 50 nm thickness is formed as capacitor protection insulating film 16 on the capacitor upper electrodes 15a, the capacitor dielectric films 14a, and the first conductive film 13 by the sputter. In this case, as the capacitor protection insulating film 16, the PZT film, a silicon nitride film, a silicon oxide nitride film, or the like may be employed in addition to the alumina film.

Figure 1G:
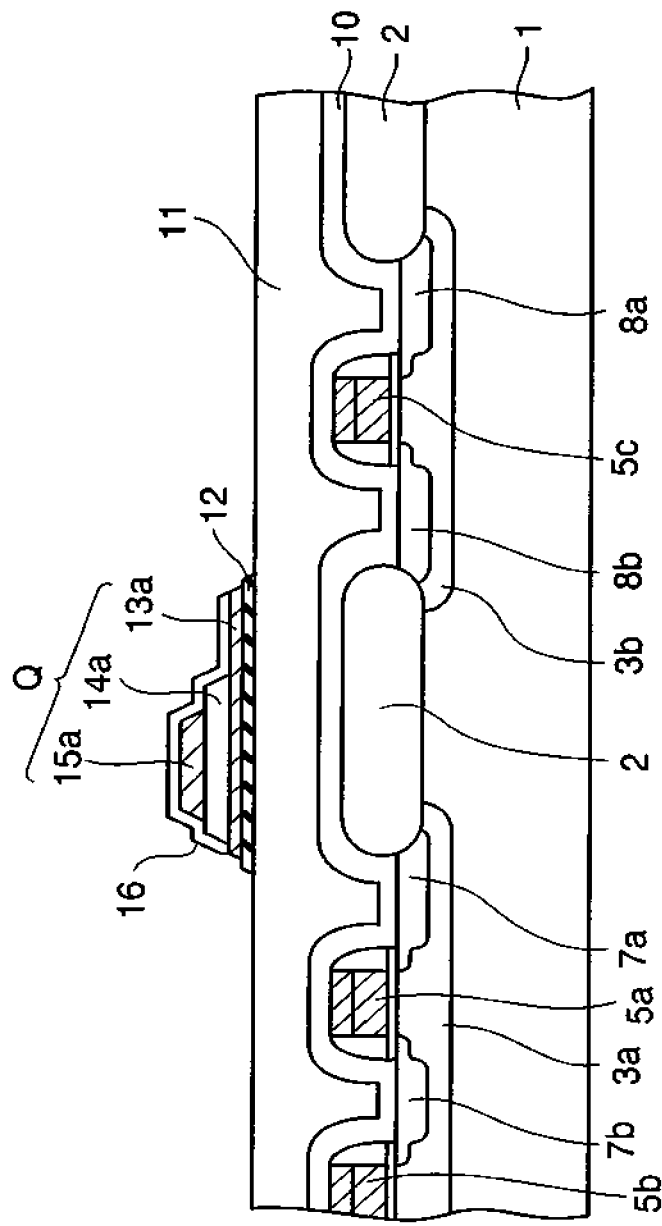

Then, as shown in FIG. 1G, the capacitor protection insulating film 16, the first conductive film 13, and the adhesive layer 12 are patterned by using a resist mask. Thus, these films are formed into stripe shapes, which are formed under a plurality of capacitor upper electrodes 15a to extend along the extending direction of the word line (gate electrode). Accordingly, capacitor lower electrodes 13a made of the first conductive film 13 are formed. In this case, the adhesive layer 12 may be considered as a part of the capacitor lower electrode 13a.

One capacitor upper electrode 15a and the underlying capacitor dielectric film 14a, and the capacitor lower electrode 13a constitute one ferroelectric capacitor Q.

Figure 1H:
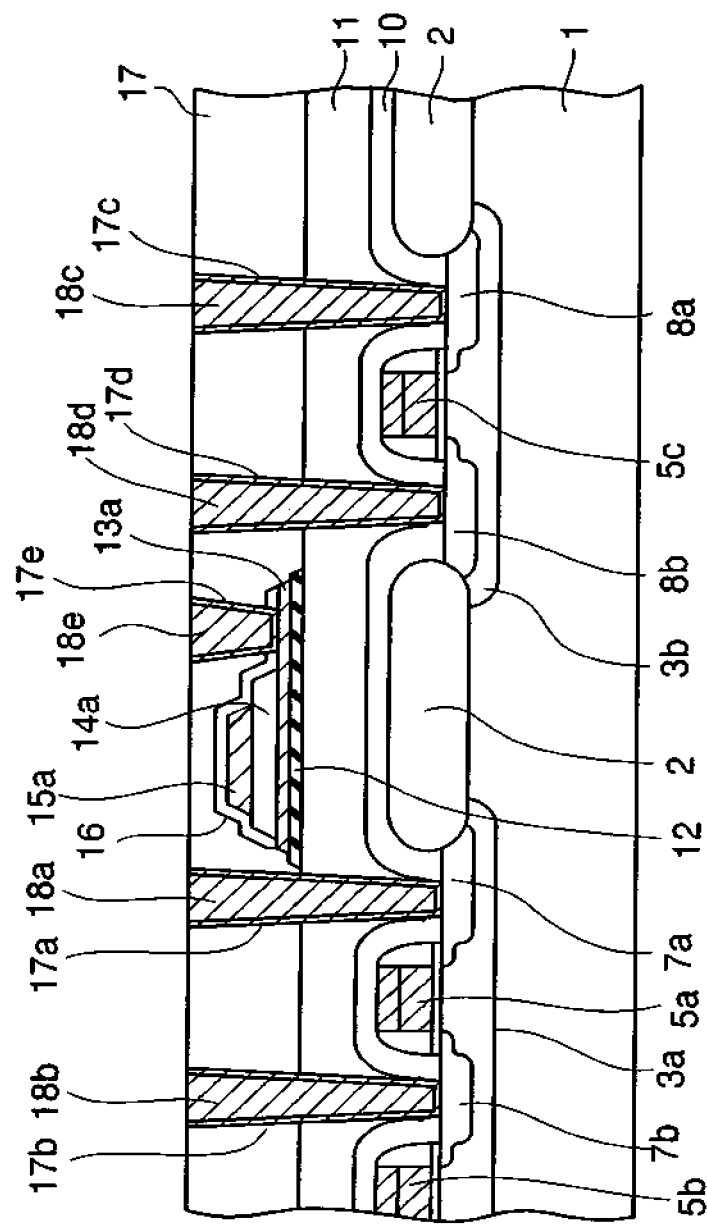

Next, steps required until a structure shown in FIG. 1H is formed will be explained hereunder.

First, a silicon oxide film of about 1 μm thickness is formed as a second interlayer insulating film 17 on the capacitor protection insulating film 16, the first interlayer insulating film 11, and the ferroelectric capacitors Q. This silicon oxide film is formed by the CVD method using TEOS. Then, an upper surface of the second interlayer insulating film 17 is planarized by the CMP method. In this example, a remaining film thickness of the second interlayer insulating film 17 after CMP is set to about 300 nm on the ferroelectric capacitor Q in the memory cell region A.

Then, the second interlayer insulating film 17, the first interlayer insulating film 11, and the cover insulating film 10 are patterned. Thus, first and second contact holes 17a, 17b are formed on the first and second n-type impurity diffusion regions 7a, 7b respectively, and at the same time third and fourth contact holes 17c, 17d are formed on the first and second p-type impurity diffusion regions 8a, 8b respectively. Then, a fifth contact hole 17e is formed in the area of the lower electrode 13a, which is out of the upper electrode 15a, by patterning the second interlayer insulating film 17 and the cover insulating film 10.

The first contact hole 17a is formed on the first n-type impurity diffusion region 7a that is formed on both sides of the p-well 3a in the memory cell region A. Also, the second contact hole 17b is formed on the second n-type impurity diffusion region 7b that is put between two gate electrodes 5a, 5b in the middle of the p-well 3a.

Then, a titanium (Ti) film of 20 nm thickness and a titanium oxide (TiN) film of 50 nm thickness are formed sequentially in the first to fifth contact holes 17a to 17e and on the second interlayer insulating film 17 by the sputter. Then, a tungsten (W) film is formed on the TiN film by the CVD method. The W film is formed to have a thickness that buries perfectly the first to fifth contact holes 17a to 17e.

Then, the Ti film, the TiN film, and the W film are removed from an upper surface of the second interlayer insulating film 17 by polishing these films by virtue of the CMP method. Thus, the Ti film, the TiN film, and the W film being left in the first to fifth contact holes 17a to 17e are used as first to fifth conductive plugs 18a to 18e respectively.

Figure 1I:
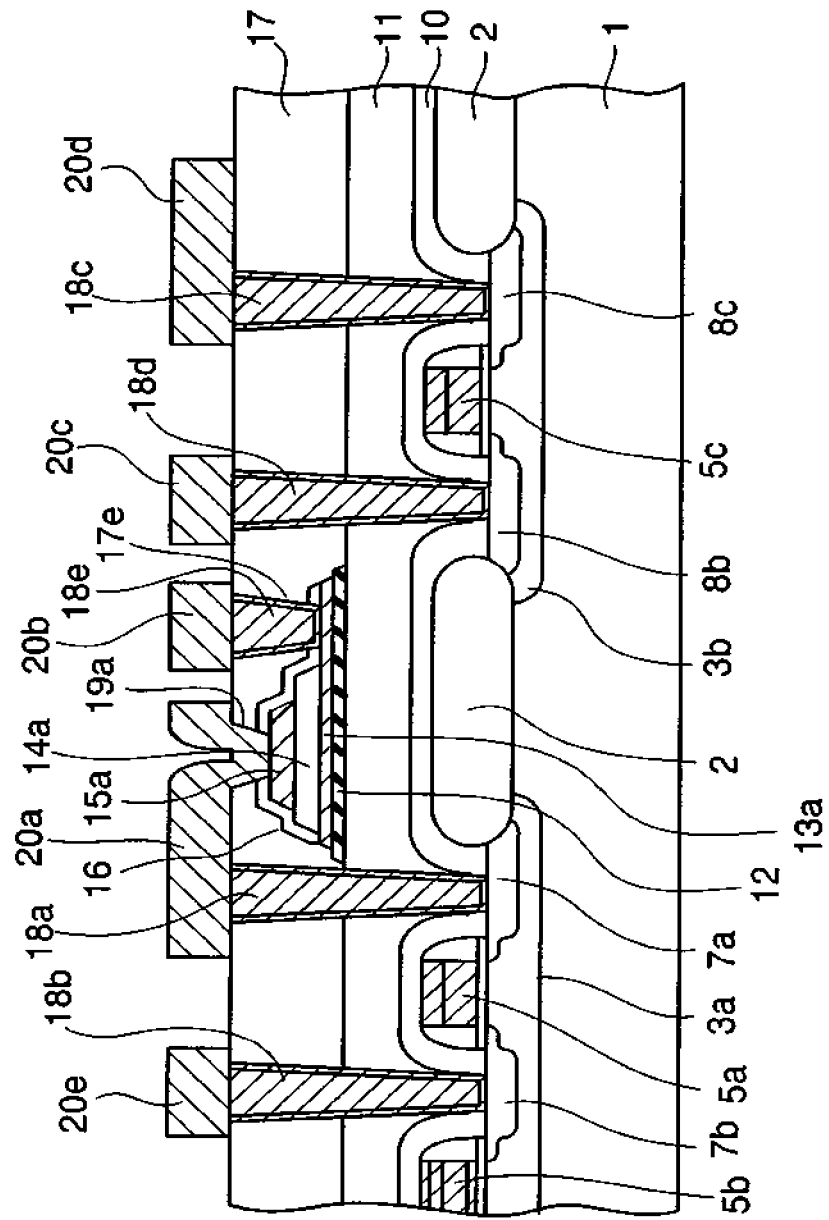

Next, steps required until a structure shown in FIG. 1I is formed will be explained hereunder.

First, an oxidation preventing film (not shown) made of silicon nitride is formed on the first to fifth conductive plugs 18a to 18e and the second interlayer insulating film 17.

Then, a sixth contact hole 19a is formed on the capacitor upper electrode 15a by patterning the oxidation preventing film and the second interlayer insulating film 17.

Then, the crystallinity of the ferroelectric film 14 constituting the capacitor dielectric film 14a is recovered by the annealing that is executed for 60 min at about 500 to 600° C. in the oxygen atmosphere. In this case, the oxidation of tungsten constituting the first to fifth conductive plugs 18a to 18e can be prevented by the oxidation preventing film. This oxidation preventing film is removed by the etching-back after the sixth contact hole 19a is formed.

Then, a metal film is formed on the second interlayer insulating film 17 and the first to fifth conductive plugs 18a to 18e and in the sixth contact hole 19a. As the metal film, a titanium oxide (TiN) film of 150 nm thickness, an aluminum film of 500 nm thickness, a Ti film of 5 nm thickness, and a TiN film of 100 nm thickness, for example, are formed sequentially on the second interlayer insulating film 17.

Then, first to fourth aluminum wirings 20a to 20d and a conductive pad 20e are formed by patterning the metal film by virtue of the photolithography method.

The first aluminum wiring 20a in the memory cell region A extends from an upper surface of the first conductive plug 18a to an inside of the sixth contact hole 19a to connect electrically the capacitor upper electrode 15a and the first conductive plug 18a. As a result, the capacitor upper electrode 15a is connected electrically to the first n-type impurity diffusion region 7a via the first aluminum wiring 20a and the first conductive plug 18a. Also, the second aluminum wiring 20b in the memory cell region A is connected electrically to the capacitor lower electrode 13a via the fifth conductive plug 18e in the fifth contact hole 17e.

The third and fourth aluminum wirings 20c, 20d are connected electrically to the p-type impurity diffusion regions 8a, 8b via the third and fourth conductive plugs 18c, 18d in the peripheral circuit region B respectively.

The conductive pad 20e in the memory cell region A is formed like an island on the second conductive plug 18b and is connected electrically to the bit line (not shown) formed thereon. The conductive pad 20e and the second conductive plug 18b are formed to connect electrically the bit line and the second n-type impurity diffusion region 7b.

After the first to fourth aluminum wirings 20a to 20d and the conductive pad 20e are formed, a third interlayer insulating film is formed, then a conductive plug is formed, and then the bit line, etc. are formed on the third interlayer insulating film. But their details will be omitted herein.

The above ferroelectric capacitor Q has the capacitor characteristics that are excellent compared to the prior art since each layers of the adhesive layer 12, the lower electrode 13a, the dielectric layer 14a, and the upper electrode 15a are improved. This advantage will be explained hereinafter in detail.

First, for the purpose of suppressing variation in the characteristics of the memory cell that consists of the ferroelectric capacitor Q and the MOS transistors $T_1$, $T_2$ in the semiconductor chip, reduction in the unevenness of the orientation of the PZT crystals that constitute the ferroelectric film 14 and also reduction in the unevenness of the orientation of the Pt crystals that constitute the lower electrode 13a will be explained hereunder.

In order to examine the influence of the surface roughness of the adhesive layer 12 formed under the Pt lower electrode 13a on the orientation characteristic of the Pt film, $SiO_2$ films of 100 nm thickness were formed on plural sheets of silicon substrates, and then a different type film was formed on the $SiO_2$ films. Here, as the different type film, a titanium oxide ($TiO_2$) film, a platinum oxide (PtO) film, and an alumina ($Al_2O_3$) film was formed on the $SiO_2$ films.

Then, a laminated structure consisting of the silicon substrate, the $SiO_2$ film, and the $Al_2O_3$ film was used as the first sample. Also, a laminated structure consisting of the silicon substrate, the $SiO_2$ film, and the PtO film was used as the second sample. In addition, a laminated structure consisting of the silicon substrate, the $SiO_2$ film, and the $TiO_2$ film was used as the third sample.

The $Al_2O_3$ film in the first sample was formed on the $SiO_2$ film in the low-pressure chamber by the sputter. As the conditions of the sputter, the bias power was set to 2.0 kW, the flow rate of the argon gas was set to 20 sccm, the substrate temperature was set to the atmospheric temperature, and the sputter time was set to 40 second. The target material used in the sputter was $Al_2O_3$.

The PtO film in the second sample was formed on the $SiO_2$ film in the low-pressure chamber by the sputter. As the conditions of the sputter, the bias power was set to 1.0 kW, the flow rate of the argon gas was set to 36 sccm, the flow rate of the oxygen gas was set to 144 sccm, the substrate temperature was set to 350° C., and the sputter time was set to 19 second. The target material used in the sputter was the platinum.

The $TiO_2$ film in the third sample was formed by oxidizing the Ti film, which was formed on the $SiO_2$ film in the low-pressure chamber by the sputter to have a thickness of 20 nm, by virtue of the rapid thermal annealing process. As the conditions of the Ti sputter, the bias power was set to 2.59 kW, the flow rate of the argon gas was set to 50 sccm, the substrate temperature was set to the atmospheric temperature, and the sputter time was set to 11 second. The target material used in the sputter was the titanium. Also, as the conditions of the rapid thermal annealing process, the substrate temperature was set to 700° C., the flow rate of the argon gas was set to 2 liter/min, the flow rate of the oxygen gas was set to 20 cc/min, and a processing time is set to 60 second.

Then, a platinum (Pt) film of 150 nm thickness was formed on the $Al_2O_3$ film in the first sample, the PtO film in the second sample, and the $TiO_2$ film in the third sample by the sputter in the vacuum chamber under the same conditions respectively. As the sputter conditions, the bias power was set to 1 kW, the flow rate of the argon gas was set to 116 sccm, the substrate temperature was set to 100° C., and the sputter time was set to 84 second.

Then, the (111) orientation rocking curves of respective Pt films in the first to third samples were obtained, and then their half widths were obtained. The measurement was carried out by the 2θ/θ method using the four-circle gonio X-ray measuring equipment. That is, there was employed the χ scan method of measuring a peak of the (111) orientation intensity while swinging the wafer in the situation that an 2θ/θ angle was fixed in vicinity of 2θ=39.8° at which the peak of the (111) orientation intensity of the Pt film has a maximum value. By employing such method, a relationship between a swing angle χ in the χ scan of the platinum film and the (111) orientation intensity was obtained, as results shown in FIG. 2.

Figure 2:
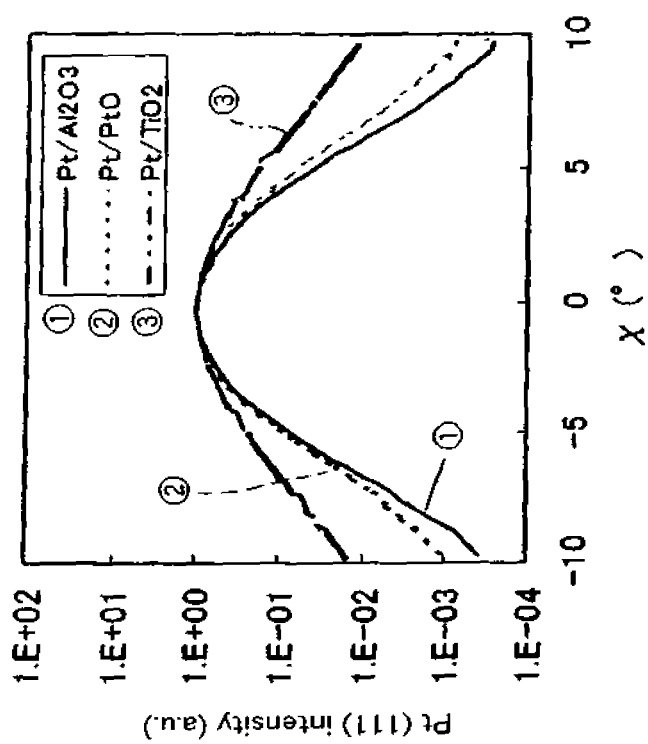
FIG. 2 is view showing measured results about a dependency of a (111) orientation intensity peak of a platinum lower electrode on an adhesive layer.

According to FIG. 2, listing the layer structure of the first to third samples with ascending order of half width of (111) orientation intensity rocking curve of the platinum film, $Pt/Al_2O_3$, Pt/PtO, and $Pt/TiO_2$ appear in this order.

Figure 3:
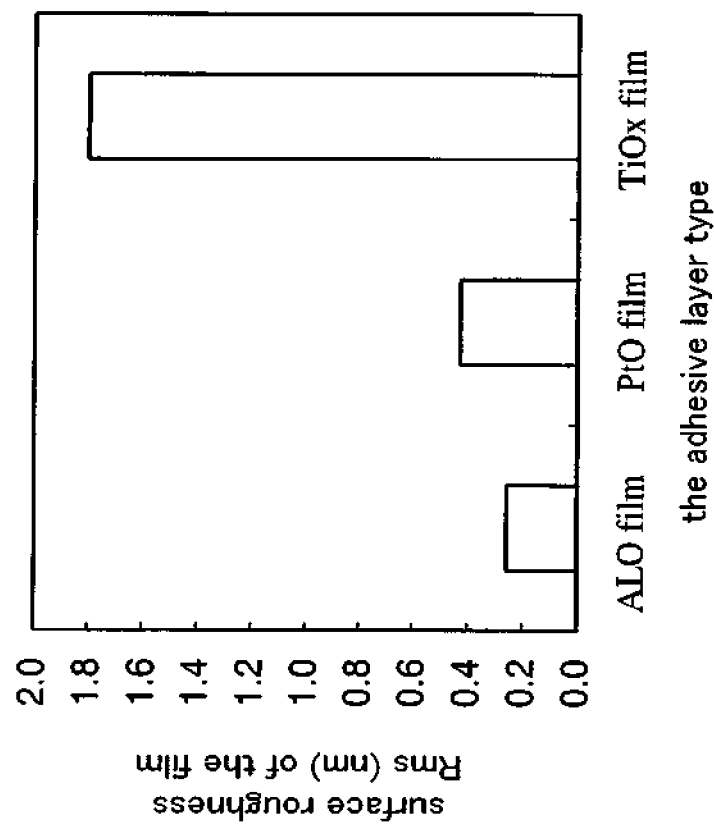
FIG. 3 is a view showing comparison of difference in surface roughness between the adhesive layers.

Also, when respective surface roughnesses Rms of the $Al_2O_3$ film, the PtO film, and the TiOx film were measured before the platinum film was formed in the first sample to the third sample, results shown in FIG. 3 were obtained. In this result, Rms of the $Al_2O_3$ film was 0.28, Rms of the PtO film was 0.43, and Rms of the $TiO_2$ film was 1.8.

Figure 4:
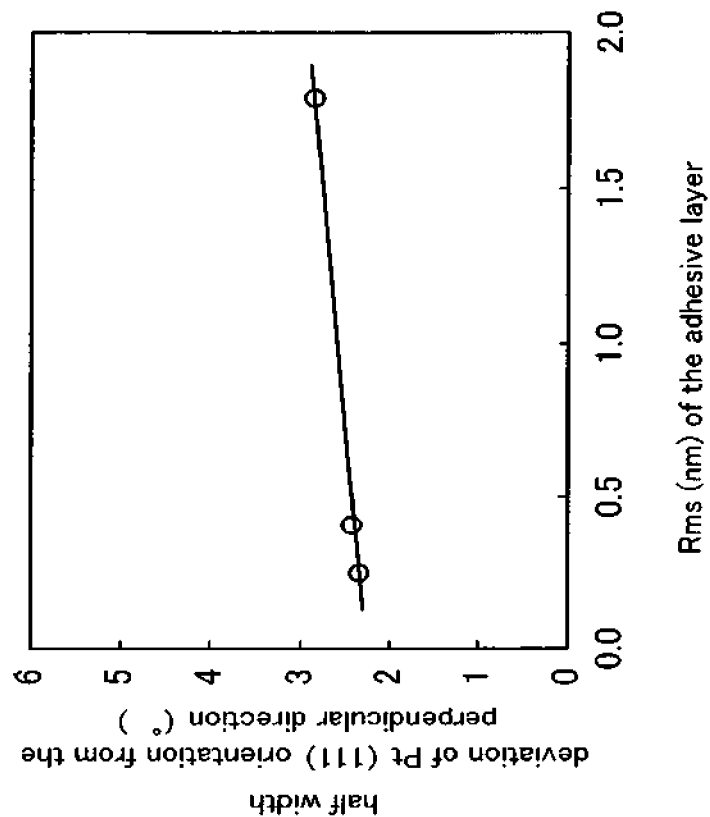
FIG. 4 is a view showing a relationship between the surface roughness of the adhesive layer and a (111) orientation of a Pt film formed on the adhesive layer.

In view of this result, when respective $Al_2O_3$, PtO, $TiO_x$ in the first sample to the third sample were used as the adhesive layer for adhering the Pt film and the $SiO_2$ film and then a relationship between the half width of the (111) orientation rocking curve of the Pt film and the surface roughness Rms of the adhesive layer was plotted, results shown in FIG. 4 were obtained. According to FIG. 4, it is appreciated that there exists a linear correlation between the half width of the (111) orientation rocking curve of the Pt film and the surface roughness Rms of the adhesive layer, and the (111) orientation characteristic of the Pt film depends largely on the surface roughness Rms of the adhesive layer, and also deviation of the (111) orientation of the Pt film from the perpendicular direction of the substrate surface is reduced as the surface roughness Rms is reduced.

The plane orientation generated from the self-orientation of Pt on the adhesive layer is (111). Therefore, according to above experimental results, there is the surface roughness of the underlying layer as the main factor for impeding the self-orientation characteristic of the platinum, and also the self-orientation of the platinum film can be accelerated if the flatness of the underlying adhesive layer is improved further. In other words, the smaller the roughness of the adhesive layer is, the more dominant the self-orientation of the platinum film becomes.

In this case, even when the adhesive layer is formed of the same material, the surface roughness Rms of such adhesive layer becomes different according to differences in the film forming conditions.

Then, the PZT film of 200 nm thickness was formed on respective Pt films in the first, second, and third samples by the sputter, then the first annealing process was applied to the PZT films in respective samples by using the rapid thermal annealing equipment, then the iridium oxide was formed on the PZT films in respective samples as the upper electrode, and then the second annealing process was applied to respective samples by using the rapid thermal annealing equipment. Then, (111) orientation characteristics of respective PZT films in the first, second, and third samples were evaluated.

As the conditions of forming the PZT film in the vacuum chamber, for example, the sputter power was set to 1 kW, the flow rate of the argon gas being introduced into the chamber was set to 20 sccm, the substrate temperature was set to 50° C., the PZT was used as the target, and the film forming time was set to 315 seconds. Also, as the conditions of the first annealing conditions, the substrate temperature was set to 585° C. and the annealing time was set to 90 sec, in the oxygen atmosphere in which the oxygen gas and the argon gas were introduced at a flow rate of 50 cc/min and a flow rate of 1.95 liter/min respectively.

Also, as the conditions of forming the iridium oxide film by the sputter, for example, the temperature of the silicon substrate 1 being put into the chamber of the sputter equipment was set to about 20° C., the flow rate of the argon gas introduced into the chamber was set to about 100 sccm, the flow rate of the oxygen ($O_2$) gas was set to 56 sccm, iridium (Ir) was used as the target, and the power applied between the target and the substrate was set to about 2.0 kW.

In addition, as the second annealing conditions, in the oxygen atmosphere in which the oxygen gas and the argon gas were introduced at a flow rate of 20 cc/min and a flow rate of 2 liter/min respectively, the substrate temperature was set to 725° C. and the annealing time was set to 20 sec.

Then, in order to evaluate respective (111) orientation characteristics of the PZT films in the first, second, and third samples, the (111) orientation rocking curves of respective PZT films were measured, and then their half widths were derived. The measurement was carried out by the 2θ/θ method using the four-circle gonio X-ray measuring equipment. That is, there was employed the χ scan method of measuring the peak of the (111) orientation intensity while swinging the wafer in the situation that an 2θ/θ angle was fixed in vicinity of 2θ=31° at which the peak of the (111) orientation intensity of the PZT film has the maximum value. By this measurement, a relationship between the swing angle χ in the χ scan of the platinum film and the (111) orientation intensity was given as results shown in FIG. 5.

Figure 5:
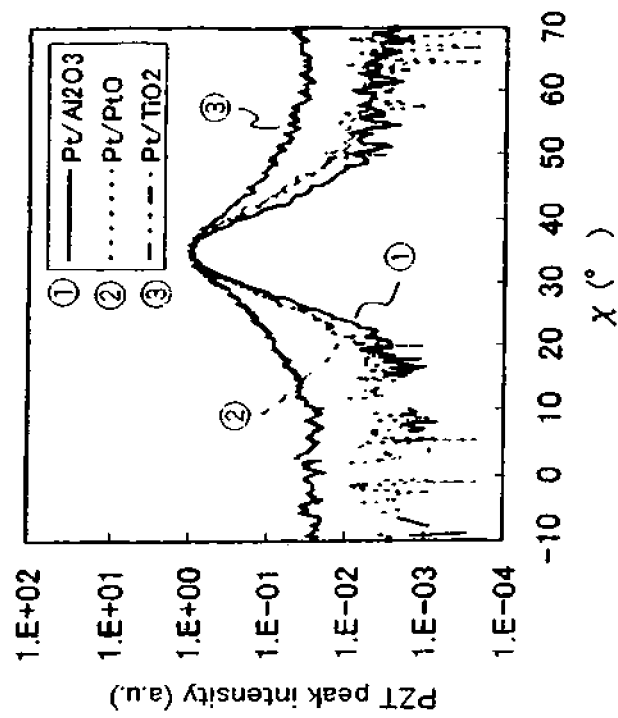
FIG. 5 is view showing measured results about a dependency of a (111) orientation intensity peak of a PZT ferroelectric film on the adhesive layer.

According to FIG. 5, listing the layer structure under the PZT film of the first to third samples with ascending order of half width of (111) orientation intensity rocking curve of the PZT film, Pt/$Al_2O_3$, Pt/PtO, and Pt/$TiO_2$ appear in this order. It should be noted that the smaller the half width of the swing angle χ is, the better the (111) orientation becomes.

Figure 6:
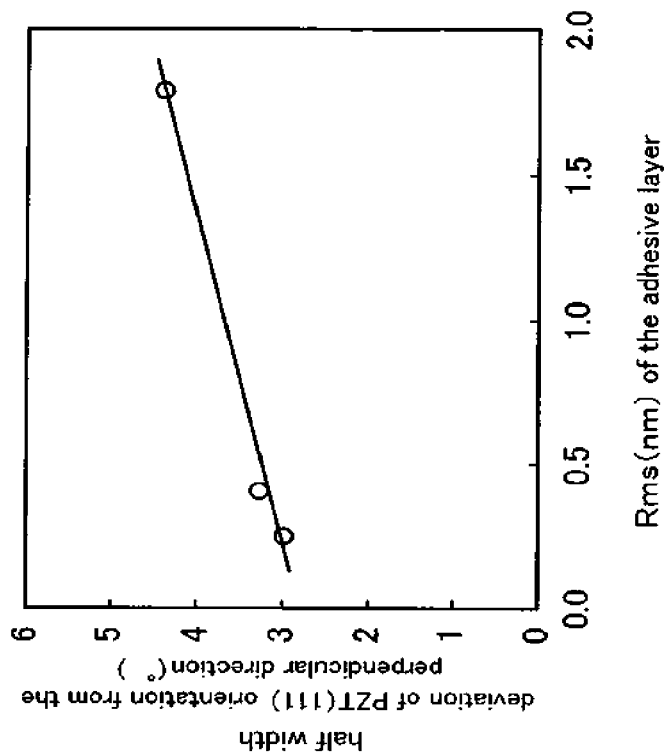
FIG. 6 is a view showing a relationship between the surface roughness of the adhesive layer and a (111) orientation of the PZT film formed on the adhesive layer via the Pt film.

Also, when the $Al_2O_3$ film, the PtO film, and the $TiO_2$ film in the first to third samples were used as the adhesive layer respectively and then a relationship between the surface roughness of the adhesive layer and the half width of the (111) orientation rocking curve of the PZT film was plotted based on the results in FIG. 3, results shown in FIG. 6 were derived.

According to FIG. 6, it is appreciated that a linear correlation between the half width of the (111) orientation rocking curve of the PZT film and the surface roughness Rms of the adhesive layer is present, and the (111) orientation characteristic of the PZT film depends largely on the surface roughness of the adhesive layer, and also the deviation of the (111) orientation of the PZT film from the perpendicular direction of the substrate surface is reduced as the surface roughness Rms becomes small.

Meanwhile, in the above embodiment, as the ferroelectric material constituting the ferroelectric capacitor, PZT, PZT into which at least one of Ca, Sr, and La is doped, Bi-layered structure compound, etc. are listed by way of example. The inventors of this application tried to improve the ferroelectric characteristic by doping an element except Ca, Sr, and La in the PZT film. At that time, iridium (Ir) constituting the upper electrode was used as the element except Ca, Sr, and La.

Then, as the method of checking the fact that Ir was doped in the crystal lattice of the PZT, the anomalous dispersion method was employed.

The anomalous dispersion is such a phenomenon that the refractive index and the dispersive power are changed largely by the resonance effect in the state that the frequency of the X-ray is close to the frequency of the atom at the absorption edge. In other words, in order to measure the X-ray diffraction intensity of a certain substance, such X-ray diffraction intensity is changed largely when the energy that is close to the absorption edge of the constitutive element of the substance is irradiated to the substance. If an energy dependency of the diffraction intensity at a particular peak is examined by utilizing this phenomenon, it is possible to make the constitutive element exhibiting such peak clear.

At this time, in order to examine the Ir-doping into the PZT film, the energy near the Ir $L_{III}$ absorption edge was utilized. It should be noted that Ir $L_{III}$ denotes the electron orbit of the Ir atom.

A first capacitor, in which the Ir-doped PZT was used as the dielectric film, and a second capacitor, in which the Ir-undoped PZT was used as the dielectric film, were used as the sample. The first and second capacitors have the lower electrode made of Pt and the electrode made of $IrO_2$ respectively.

First, it was checked whether or not Ir in the $IrO_2$ film constituting the upper electrode of the first and second capacitors has no influence on the anomalous dispersion measurement.

Figure 7:
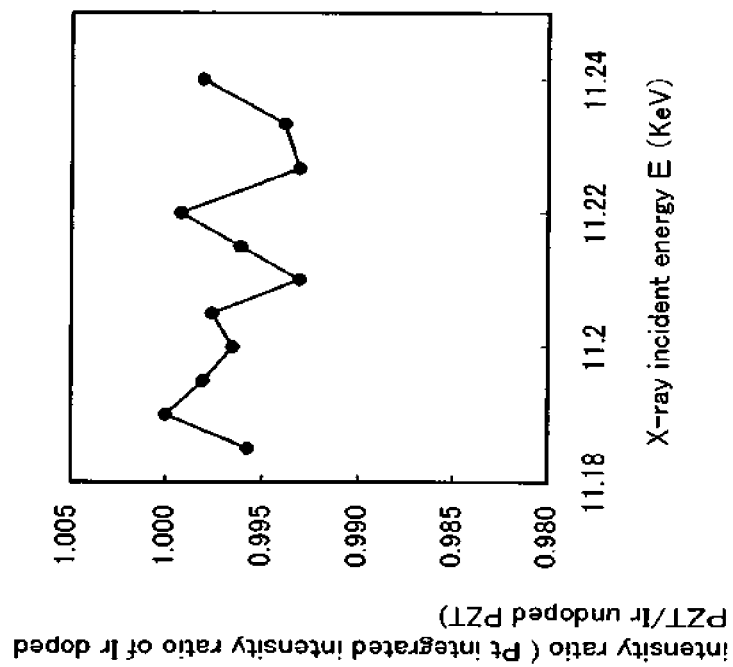
FIG. 7 is a view showing a ratio of a (111) orientation integrated intensity of a Pt lower electrode of a capacitor having an Ir-doped PZT to a (111) orientation integrated intensity of a Pt lower electrode of a capacitor having an Ir-undoped PZT with respect to an X-ray incident energy.

A dependency of the peak of the (111) orientation intensity of the lower electrode on the X-ray incident energy is shown in FIG. 7. As the X ray, a wavelength that is in vicinity of the Ir $L_{III}$ absorption edge was used. In FIG. 7, in order to make the understanding easy, values obtained by normalizing the (111) orientation integrated intensity of Pt constituting the lower electrode of the first capacitor by the (111) orientation integrated intensity of Pt constituting the lower electrode of the second capacitor are employed.

According to FIG. 7, it is appreciated that, since sharp reduction in an intensity ratio does not appear in all X-ray incident energy ranges, the absorption effect by Ir in the $IrO_2$ film of the upper electrode was not observed and thus Ir did not affect the anomalous dispersion measurement.

Figure 8:
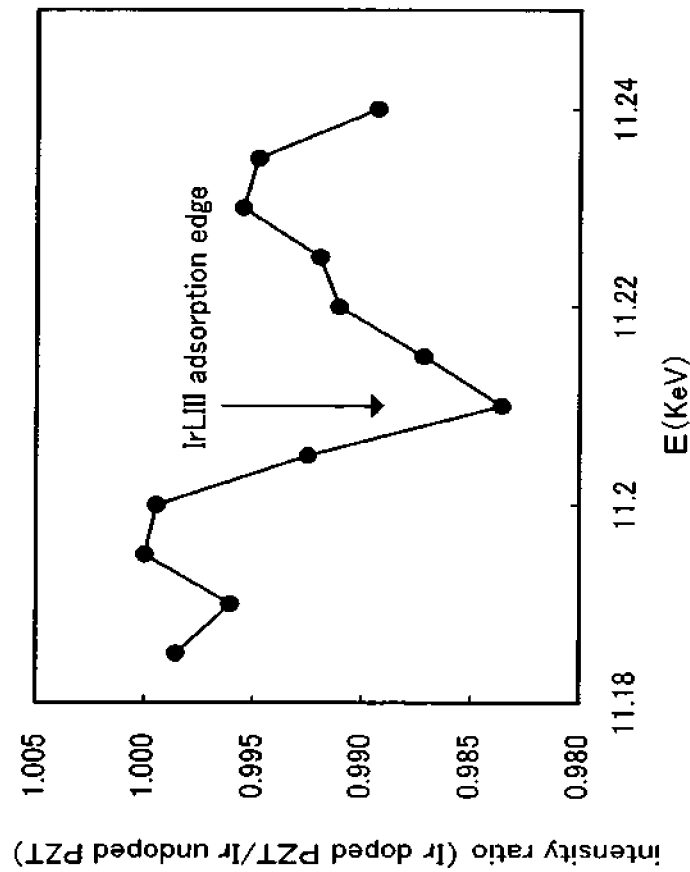
FIG. 8 is a view showing a relationship between a (111) orientation integrated intensity ratio of the Ir-doped PZT and the Ir-undoped PZT and the X-ray incident energy.

Next, the peak of the (111) orientation intensity of the PZT was obtained while changing the X-ray incident energy near the absorption edge of the Ir $L_{III}$ absorption edge, and then results obtained by plotting the integrated peak intensities with respect to the incident energy are shown in FIG. 8. In FIG. 8, in order to make the understanding easy, values obtained by normalizing the (111) integrated intensity of PZT of the first capacitor by the (111) integrated intensity of PZT of the second capacitor are employed.

According to FIG. 8, reduction in the intensity ratio is increased at the Ir $L_{III}$ absorption edge of 11.21 eV. This shows clearly the fact that Ir is contained in the crystal lattice of the Ir-doped PZT. Therefore, it is understood that Ir of the Ir-doped PZT is not simply diffused into the PZT film but such Ir is contained as the PZT crystal constitutive element of the Ir-doped PZT.

As the method of causing Ir to be contained in the PZT lattice, for example, there are the method of forming a conductive film (upper electrode) made of $IrO_x$ or Ir on the PZT film and then diffusing Ir in the conductive film into the PZT film by the annealing, the method of forming the PZT by the sputtering while using PZT, into which Ir is added, as a target, the method of forming the PZT by the spin-on method while using the sol-gel solution that contains an Ir element, the method of forming the PZT by the spin-on method while using the COD solution that contains the Ir element, the method of forming the PZT by the MOCVD method while using the material that contains Ir, etc.

In the case where the Ir-doped PZT film is formed by the MOCVD method, a following liquid organic source, for example, is employed.

As the organic source for supplying lead (Pb), material in which $Pb(DPM)_2(Pb(C_{11}H_{19}O_2)_2)$ is dissolved in the THF (TetraHydroFuran: $C_4H_8O$) liquid is used. Also, as the organic source for supplying zirconium (Zr), material in which $Zr(DMHD)_4(Zr(C_9H_{15}O_2)_4)$ is dissolved in the THF liquid is used. In addition, as the organic source for supplying titanium (Ti), material in which $Ti(O-iPr)_2(DPM)_2(Ti(C_3H_7O)_2(C_{11}H_{19}O_2)_2)$ is dissolved in the THF liquid is used. Further, as the organic source for supplying iridium (Ir), material in which $Ir(DMP)_3(Ir(C_{11}H_{19}O_2)_3)$ is dissolved in the THF liquid is used.

These organic sources are vaporized by a vaporizer that has a sublimation temperature of 190° C. respectively, and then are introduced into the ferroelectric film growing atmosphere together with the oxygen ($O_2$) gas. It is preferable that, in order to control a partial pressure of the oxygen gas, an inert gas, e.g., argon or nitrogen should be mixed with the oxygen gas. The inert gas is used as the carrier gas of the organic source, and a flow rate of the inert gas is set to 300 sccm, for example. Also, the substrate temperature is set to 540° C. and a growth rate is set to 20 nm/min. In addition, a pressure in the chamber that define the ferroelectric film growing atmosphere is set to 5 Torr.

Figure 9:
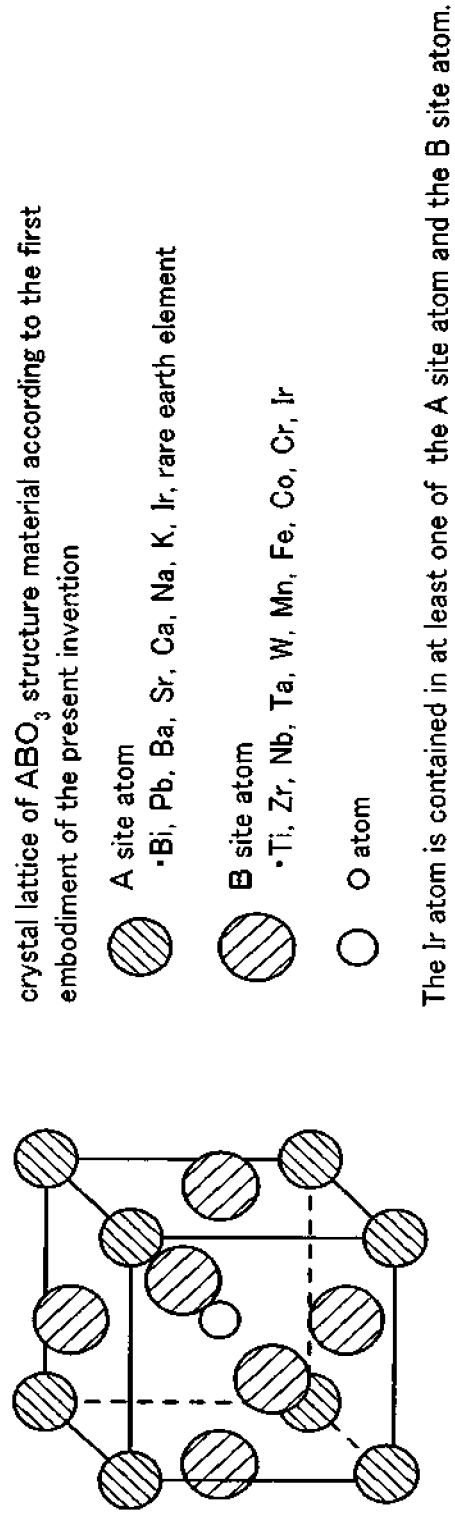
FIG. 9 is a view showing a crystal lattice of $ABO_3$ structure material according to the first embodiment of the present invention.

By the way, the PZT-based crystal and the Bi-layered structure compound crystal constituting the dielectric film of the ferroelectric capacitor have an $ABO_3$ perovskite structure. Then, the $ABO_3$ perovskite structure into which Ir is undoped exhibits the structure in which, as shown in FIG. 9, Ir is contained in at least one of a part of A site atoms and B site atoms. In this case, in FIG. 9, the A site atom except Ir is any one of Bi, Pb, Ba, Sr, Ca, Na, K, and a rare earth element, and the B site atom except Ir is any one of Ti, Zr, Nb, Ta, W, Mn, Fe, Co, and Cr. A plurality of A atoms are present in the perovskite structure in one unit, but these atoms are not always identical. This is true of the B site atoms.

Next, the examination was made to check what influence is exerted on the characteristic of the ferroelectric capacitor by such Ir-doped PZT film.

First, the sample A, the sample B, and the sample C having the structure shown in FIG. 1I were prepared. The sample A, the sample B, and the sample C have the same structure except the layer structure of the ferroelectric capacitor Q.

As the adhesive layer 12 of the sample A, the $Al_2O_3$ film whose surface roughness Rms was 0.28 nm was used. Then, the first conductive film 13 made of Pt and having a thickness of 150 nm was formed on the adhesive layer 12, then the PZT film of 200 nm thickness was formed as the ferroelectric film 14 on the first conductive film 13 by the sputter, then the first rapid thermal annealing process was applied to the PZT film, then $IrO_x$ was formed as the second conductive layer 15 on the PZT film, and then the second rapid thermal annealing process was applied to the PZT film at the temperature higher than that in the first rapid thermal annealing process.

As the adhesive layer 12 of the sample B, the $TiO_x$ film whose surface roughness Rms is 1.8 nm was used. Then, the first conductive film 13 made of Pt and having a thickness of 150 nm was formed on the adhesive layer 12, then the PZT film of 200 nm thickness was formed as the ferroelectric film 14 on the first conductive film 13 by the sputter, then the first rapid thermal annealing process was applied to the PZT film, then $IrO_x$ was formed as the second conductive layer 15 on the PZT film, and then the second rapid thermal annealing process was applied to the PZT film at the temperature higher than that in the first rapid thermal annealing process.

As the adhesive layer 12 of the sample C, the Ti film whose surface roughness Rms is 0.76 nm was used. Then, the first conductive film 13 made of Pt and having a thickness of 150 nm was formed on the adhesive layer 12, then the PZT film of 200 nm thickness was formed as the ferroelectric film 14 on the first conductive film 13 by the sputter, then the rapid thermal annealing process was applied to the PZT film, and then $IrO_x$ was formed as the second conductive layer 15 on the PZT film. In this case, in the sample C, in order to prevent the diffusion of the Ir element into the PZT film, the second rapid thermal annealing process was not applied after the second conductive layer 15 was formed.

Here, the forming conditions of the Pt film serving as the first conductive film 13 of the sample A, the sample B, and the sample C were set equal to the forming conditions of the Pt film in the above first sample. Also, the forming conditions of the PZT film serving as the ferroelectric film 14 of the sample A, the sample B, and the sample C were set equal to the forming conditions of the PZT film in the first sample.

Differences in the sample A, the sample B, and the sample C are shown in Table 1.

TABLE 1

|  | Rms of PZT(111) adhesive | Ir diffusion into PZT | Deviation of from perpendicular layer direction |
|---|---|---|---|
| sample A | small | executed | 2.9 degree |
| sample B | large | executed | 4.5 degree |
| sample C | small | not executed | 2.3 degree |

Then, the ferroelectric capacitors Q are formed by forming the adhesive layer, the Pt film, the PZT film, and the upper electrode layer in the sample A, the sample B, and the sample C according to the same steps as those in FIGS. 1E, 1F, and 1G respectively. Then, as shown in FIGS. 1H and 1I, these ferroelectric capacitors Q were covered with the interlayer insulating film 11, then the contact holes 17e, 19a were formed on the interlayer insulating film 11, and then the aluminum wirings 20a, 20b that were connected to the upper electrode 15a and the lower electrode 13a of the ferroelectric capacitor Q were formed on the interlayer insulating film 11 via the contact holes 17e, 19a.

In this case, 1656 units of the ferroelectric capacitors, each having a planar shape of 1.0×1.5 μm$^2$, were formed on the interlayer insulating film 11 in each sample.

As for the sample A, the sample B, and the sample C having such ferroelectric capacitor Q, when the polarization switch $Q_{SW}$ of the ferroelectric capacitor Q was measured respectively, characteristics shown in FIG. 10 were obtained.

According to FIG. 10, Qsw of the capacitor having the PZT film into which Ir is diffused in the sample A and the sample B becomes higher than Qsw of the capacitor having the PZT film into which Ir was not diffused in the sample C by about 5 μC/cm$^2$. The reason for this may be considered such that Ir is present in the PZT film to fill the lattice defect in the PZT film. Then, when the Ir-undoped PZT film and the Ir-doped PZT film are applied as the dielectric layer of the ferroelectric capacitor respectively, difference in a relationship between a voltage and a residual polarization charge was examined. At that time, results shown in FIG. 11 were obtained.

Also, in FIG. 10, when the sample A and the sample B both having the PZT film in which Ir was present were compared with each other, $Q_{SW}$ of the sample A becomes higher than $Q_{SW}$ of the sample B by about 1 to 2 μC/cm$^2$. As described above, the reason for this may be considered such that, since the surface roughness of the adhesive layer 12 in the sample A was smaller than that in the sample B, variation in the crystal orientation of the Pt film and the PZT film on the adhesive layer and thus the performance of the capacitor was increased up to a slightly high level.

Then, as for the sample A, the sample B, and the sample C, the 256-bit FeRAM chip in the 2T2C system, i.e., the system in which 2 MOS transistors and 2 ferroelectric capacitors are used respectively to operate 1 bit, was manufactured and then the FeRAM chip was assembled into the package.

Then, the data were written into the FeRAM at the atmospheric temperature, then such FeRAM was baked at 260° C., and then a test was executed to check whether or not the data that have been written before the baking can be read. At that time, results shown in FIG. 12 were obtained.

Figure 12:
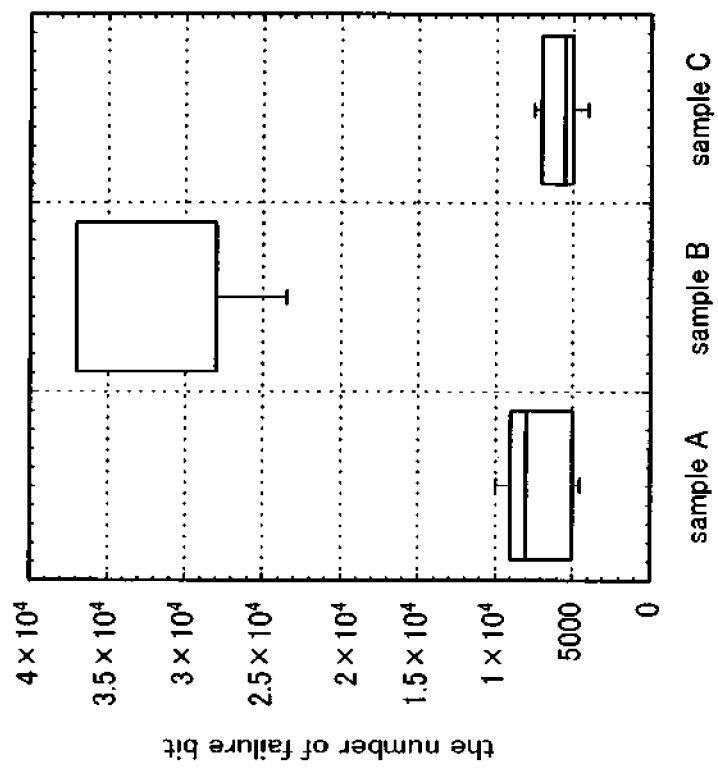
FIG. 12 is a view showing a relationship of a failure bit number between the capacitor having the Ir-doped PZT and the capacitor having the Ir-undoped PZT.

According to FIG. 12, the number of failure bit in the 256 bits in the sample B became larger than those in the samples A and C. That is, it is found that the number of failure bit was increased in the sample B in which the crystal orientation of the PZT film was varied compared to those in the samples A and C. This is because the upper surface roughness of the adhesive layer formed under the lower electrode of the ferroelectric capacitor in the sample B is large rather than those in the samples A and C.

Therefore, in order to check a relationship between the crystal orientation and the number of failure bit, a relationship between an inclination of the orientation of the PZT (111) oriented crystal grain and the number of failure bits from which the data cannot be read was examined in respective samples A, B, C. At that time, results shown in FIG. 13 were derived. An abscissa of FIG. 13 denotes the inclination of the PZT (111) oriented crystal grains, which indicates a magnitude of the inclination (discrepancy) from the perpendicular direction of the upper surface of the substrate, while an ordinate of FIG. 13 denotes the number of failure bit.

Figure 13:
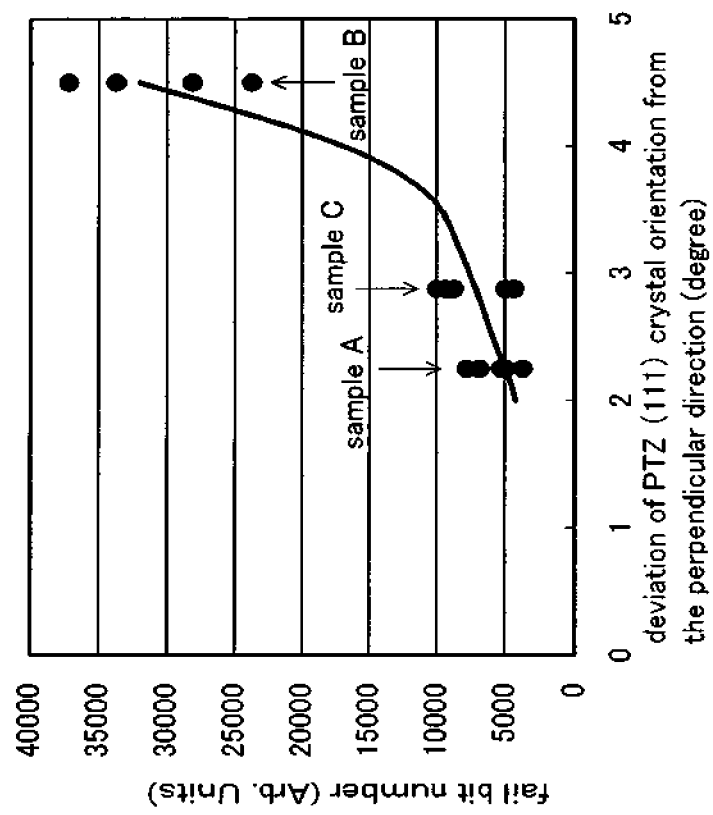
FIG. 13 is a view showing a relationship between a discrepancy of a PZT orientation and the failure bit number.

As can be seen from FIG. 13, it is appreciated that when (111) oriented crystal grain of PZT is largely inclined from the perpendicular direction of the substrate and, when the inclination exceeds 3.5°, the number of failure bit increase drastically.

Figure 14:
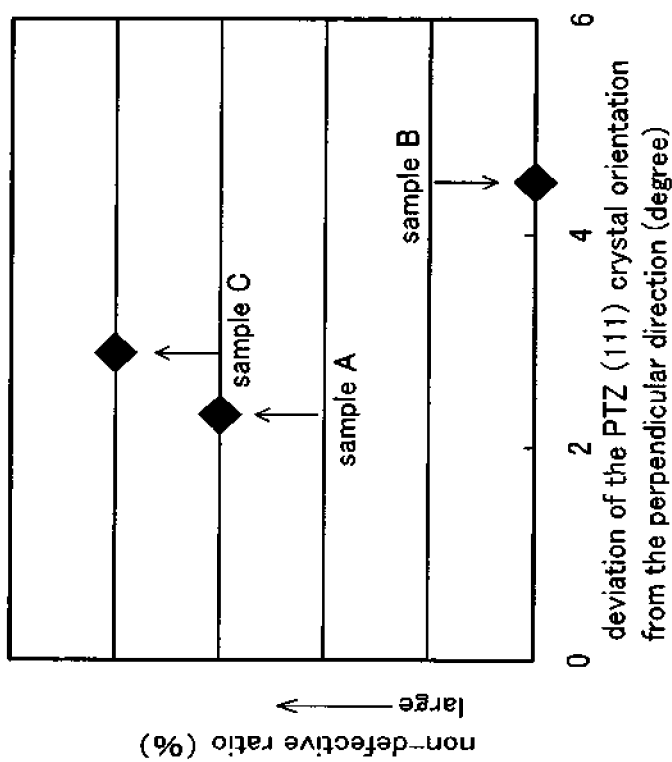
FIG. 14 is a view showing a relationship between the discrepancy of the PZT orientation and a non-defective ratio.

Also, when the same test was executed after the baking temperature was changed into 230° C., a relationship between the inclination of the PZT (111) orientation and a non-defective ratio was given as results shown in FIG. 14. Where the "non-defective unit" means that the number of failure bit is 0.

As can be seen from FIG. 14, it is understood that, if the inclination of the orientation of the PZT (111) oriented crystal grain is increased, the non-defective ratio is lowered. According to FIG. 13 and FIG. 14, in order to improve the device performance, the inclination of the orientation of the PZT (111) oriented crystal grain from the perpendicular direction of the substrate surface must be set smaller than 3.5° or less.

That is to say, since the inclination of the orientation of the PZT (111) oriented crystal grain from the perpendicular direction of the substrate surface is reduced, the capacitor performance in each bit of 256 bits can be improved and also variation in the capacitor performance can be suppressed. As a result, the number of failure bit can be reduced and also the non-defective ratio can be improved.

Also, according to above FIG. 6, in order to set the inclination of the orientation of the PZT (111) oriented crystal grain from the perpendicular direction of the substrate surface to 3.5° or less, it can be estimated from the approximation curve that the surface roughness of the adhesive layer must be set smaller than 0.79 nm or less.

Also, according to above FIG. 4, it can be estimated from the approximation curve that, when the surface roughness Rms of the adhesive layer is reduced smaller than 0.79 nm or less, the inclination of the Pt (111) oriented crystal grain from the perpendicular direction of the substrate surface is reduced smaller than 3.5° or less.

Next, as for the sample A, the sample B, and the sample C, the 256-bit FeRAM chip in the 1T1C system, i.e., the system in which 1 MOS transistor and 1 ferroelectric capacitor are used respectively to operate 1 bit, was manufactured on the wafer respectively.

The 1T1C system has such an advantage that a chip size can be reduced smaller than the 2T2C system, but the capacitor performance required of the capacitor becomes severer than the 2T2C system.

Figure 15:
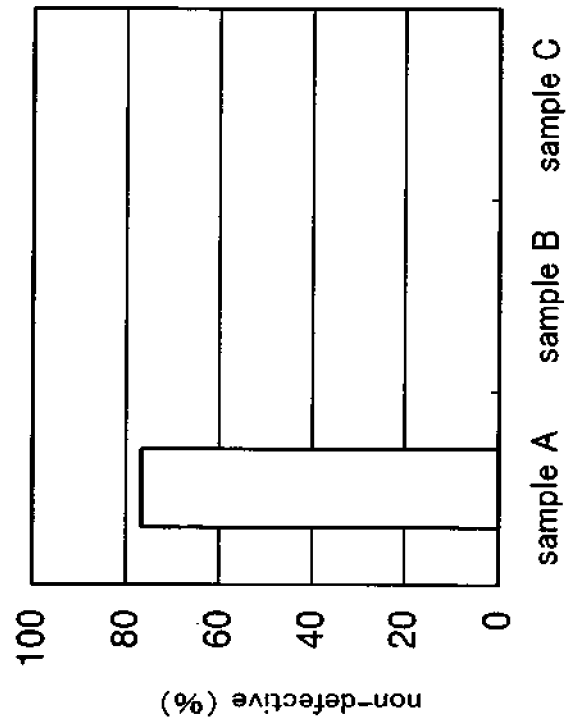
FIG. 15 is a view showing the non-defective ratio in the 1T1C system capacitor after the baking executed at 230° C.

When the test of writing the data to the sample in the wafer state, then baking the sample at 230° C., and then reading the data was applied to the sample A, the sample B, and the sample C respectively, results shown in FIG. 15 were obtained. According to FIG. 15, it is understood that the non-defective ratio indicates that the non-defective unit could be obtained only in the sample A. The reason why the non-defective unit could not be obtained in the sample B is due to the fact that the inclination of the orientation of the PZT (111) oriented crystal grain from the perpendicular direction of the substrate surface is increased.

In contrast, the reason why the non-defective unit could not be obtained in the sample C is due to the fact that variation in respective bits is small, but Ir is not diffused into the PZT lattice and thus the capacitor performance required of the 1T1C system cannot be satisfied because of the low Qsw, as shown in FIG. 10.

According to the above, in order to increase the capacity of the FeRAM and miniaturize the chip size, it is necessary to make compatible following two requirements; one requirement is to reduce the deviation of orientation of the PZT (111) oriented crystal grain from the perpendicular direction of the substrate surface, and the other is to incorporate Ir into PZT lattice.

TABLE 2

Influence in Each Sample

|  | Cell Variation | Capacitor Performance | Total |
|---|---|---|---|
| Sample A | ○ | ○ | ○ |
| Sample B | X | ○ | X |
| Sample C | ○ | ? | ? |

○ ... good,
? ... a little good,
X ... bad

In the semiconductor device manufacturing steps shown in FIGS. 1A to 1I, the platinum is formed as the first conductive film 13 that is formed on the adhesive layer 12. But the material having the self-orientation characteristic, e.g., iridium, titanium, etc. may be employed in place of the platinum.

(Second Embodiment)

In the present embodiment, formation of the ferroelectric film on the adhesive layer, whose surface roughness is small, by the MOCVD method will be explained hereunder.

In the present embodiment, like the first embodiment, the FeRAM is formed along the steps explained with reference to FIGS. 1A to 1I.

More particularly, as shown in FIG. 1A, the alumina layer of 10 nm thickness is formed as the adhesive layer 12, whose surface roughness is 0.79 nm or less, on the first interlayer insulating film 11. As the conditions applied to form the alumina layer by the sputter, for example, the temperature of the silicon substrate 1 in the chamber is set to 230° C., then a flow rate of the argon gas being introduced into the chamber is set to 20 sccm, the alumina is used as the target, and then a power applied between the target and the substrate is set to 2 kW.

Then, as shown in FIG. 1B, the first conductive film 13 is formed on the adhesive layer 12. In this case, in the present embodiment, the titanium film and the iridium film are formed as the first conductive film by the sputter.

The titanium (Ti) film is formed to have a thickness of 10 nm. As the conditions applied to form the Ti film by the sputter, for example, the temperature of the silicon substrate 1 put into the chamber is set to about 500° C., then a gas pressure of the argon gas being introduced into the chamber is set to 0.15 Pa, the titanium is used as the target, and then a power applied between the target and the substrate is set to about 2.6 kW.

The iridium (Ir) film is formed to have a thickness of 10 to 400 nm, for example, 150 nm. As the conditions applied to form the Ir film by the sputter, for example, the temperature of the silicon substrate 1 put into the chamber is set to about 500° C., then a flow rate of the argon gas being introduced into the chamber is set to about 200 sccm, the iridium is used as the target, and then a power applied between the target and the substrate is set to about 0.3 kW.

Then, as shown in FIG. 1C, the PZT film of 120 nm thickness is formed as the ferroelectric film 14 on the first conductive film 13. In this case, in the present embodiment, the PZT film is formed by the MOCVD method under conditions described in the following.

The growth temperature of the PZT film on the silicon substrate 1 put in the chamber (not shown) is set to 620° C. Then, out of the elements constituting the PZT film, $Pb(DPM)_2$ was used as the material of Pb, $Zr(DMHD)_4$ was used as the material of Zr, and $Ti(O-iPr)_2(DPM)_2$ was used as the material of Ti. These materials are dissolved in the THF at a concentration of 3% mole ratio, then transferred to the vaporizer in the liquid state, then vaporized together with the THF at the temperature of 260° C., for example, in the vaporizer, then mixed with the oxygen, and then sprayed onto the first conductive film 13 in the chamber via the shower head.

As for respective flow rates of the material gases being introduced into the chamber, a Pb material gas, a Zr material gas, and a Ti material gas are set to 0.365 ml/min, 0.196 ml/min, and 0.175 ml/min respectively during the initial growth of 20 second, and then the Pb material gas, the Zr material gas, and the Ti material gas are set to 0.376 ml/min, 0.277 ml/min, and 0.214 ml/min respectively during the subsequent 505 second.

A thickness of the PZT film formed under such conditions was 120 nm, and its compositions were Pb/(Zr+Ti)=1.17 and Zr/(Zr+Ti)=0.43.

Since the PZT film being formed by the MOCVD method is crystallized, the annealing required of the crystallization can be omitted.

Then, as shown in FIG. 1D, the iridium oxide film of 200 nm thickness is formed as the second conductive film 15 on the PZT film as the ferroelectric film 14 by the sputter. The forming conditions of the iridium oxide film are set similarly to the first embodiment.

Then, the ferroelectric capacitors Q are formed by patterning sequentially the second conductive film 15, the ferroelectric film 14, the first conductive film 13, and the adhesive layer 12 along the steps executed in above FIGS. 1E to 1G. In this case, the second conductive film 15 serves as the upper electrode 15a, the ferroelectric film 14 serves as the dielectric film 14a, and the first conductive film 13 serves as the lower electrode 13a.

Since the subsequent steps are similar to the first embodiment, such steps will be omitted herein.

According to the above steps, in the PZT ferroelectric film 14 that is formed on the lower electrode 13a, the (111) orientation intensity of the upper surface of which is high, at the high substrate temperature of 620° C. by the MOCVD method, orientation of 90% or more of PZT grains can be aligned to (111) at the upper surface of the PZT ferroelectric film 14.

This is because the alumina film having good flatness is formed as the adhesive layer 12 on the interlayer insulating film 11 so as to improve the orientation characteristic of the lower electrode 13a, and thus the Ti film on the alumina film is oriented in the c axis and then the Ir film formed thereon is oriented to (111).

When the half widths of an (222) orientation intensity in the XRD profiles of both the iridium film, which is formed on the silicon oxide film as the prior art, and the iridium film, which is formed on the silicon oxide film via the alumina film and the titanium film in the present embodiment, were examined, results shown in Table 3 were derived. It is appreciated that the (111) orientation of the iridium film according to the present embodiment can be improved rather than the prior art.

Table 3
An XRD half width of Ir (222) when the lower electrode structure is changed

| lower electrode structure | half width |
|---|---|
| Ir/SiO$_2$ | 7.2° |
| Ir/Ti/ALO/SiO$_2$ | 2.1° |

Figure 16:
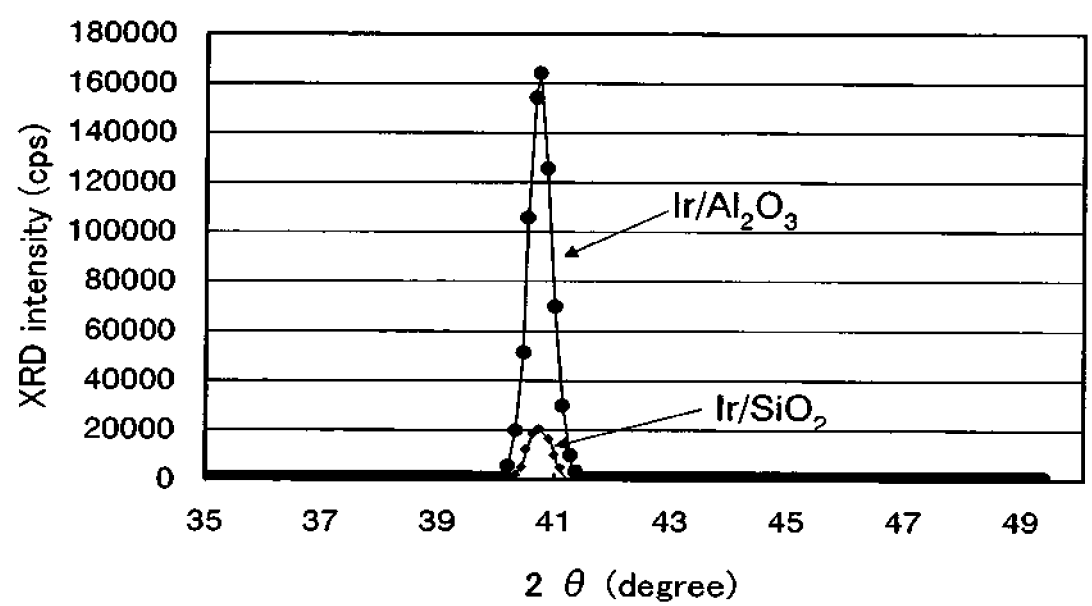
FIG. 16 is a view showing an Ir (111) X-ray diffraction intensity, which is compared with the prior art structure, to check how an adhesive layer employed in a semiconductor device according to a second embodiment of the present invention should exert an influence upon a (111) orientation of an iridium film.

When the orientation of the Ir film that is formed on the adhesive layer 12, which is made of alumina having the good surface flatness, by the sputter was measured by the XRD method, the XRD profile indicated by a solid-line curve shown in FIG. 16 was derived. According to the solid-line curve in FIG. 16, it is found that the (111) orientation having the sufficiently high intensity can be obtained in the Ir film.

In contrast, when the Ir film was formed on the interlayer insulating film 11 made of SiO$_2$ by the sputter without use of the adhesive layer 12 and then the orientation of the Ir film was measured by the XRD method, the XRD profile indicated by a broken-line curve shown in FIG. 16 was derived. It is found that the (111) orientation intensity of the Ir film was very small.

Figure 17:
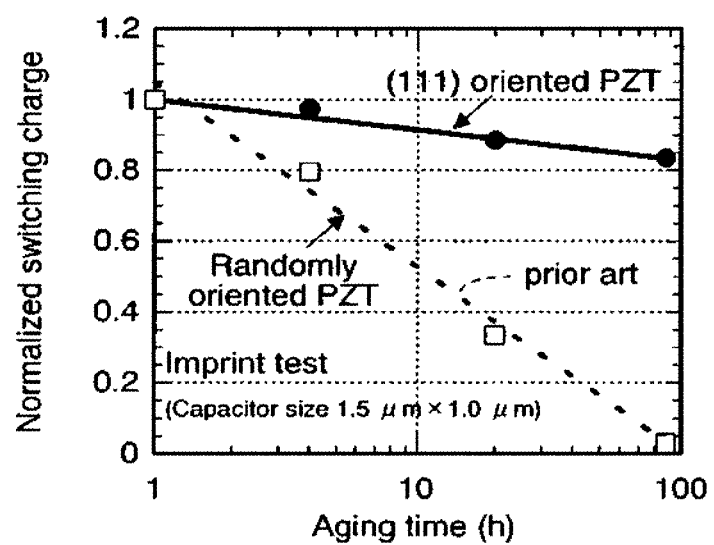
FIG. 17 is a view showing imprint characteristics of the capacitor, which employs the PZT formed by the method in the prior art and the capacitor, which employs the PZT formed by a film forming method in the second embodiment of the present invention.

Also, when the imprint characteristic of the FeRAM having the ferroelectric capacitor, which is formed on the adhesive layer 12, and the imprint characteristic of the FeRAM having the ferroelectric capacitor, which is formed directly on the interlayer insulating film 11, were examined respectively, results shown in FIG. 17 were derived. As a result, according to the FeRAM having the ferroelectric capacitor that was formed by the MOCVD method under the conditions in the present embodiment, a sufficient reading margin can be maintained after 100 hours have lapsed.

Next, analysis results of the capacitor, in which the failure bit was generated, and the capacitor, in which the failure bit was not generated, will be explained hereunder.

Figure 18A:
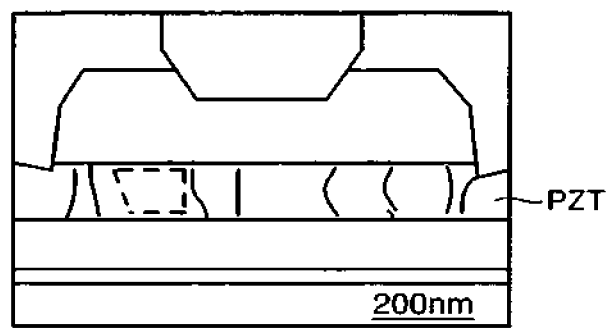
FIG. 18A is a sectional view showing a cross section of the capacitor in which the failure bit occurs.
Figure 18B:
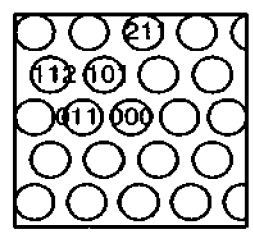
FIG. 18B is a view showing an electron diffraction image in the PZT crystal.

First, the (111) orientation of the PZT crystal of the ferroelectric film in the capacitor, in which the failure bit was generated, was examined. FIG. 18A is a sectional view depicted based on the image of the capacitor, in which the failure bit occurred, picked up by the transmission electron microscope. FIG. 18B is an electron diffraction image in a range, in which the PZT crystal indicated by a broken line in FIG. 18A is not oriented in the <111> direction. According to this, the (111) orientation ratio of the PZT film is estimated as about 85% at the utmost.

Figure 19:
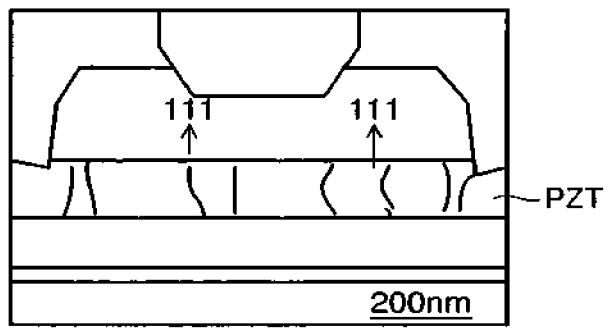
FIG. 19 is a sectional view showing a cross section of the capacitor in which the failure bit does not occur.

Then, the (111) orientation of the PZT crystal of the ferroelectric film in the capacitor, in which the failure bit was generated, was examined. FIG. 19 is a sectional view depicted based on the image of the capacitor, in which the failure bit did not occur, picked up by the transmission electron microscope. The grains in the PZT film are oriented uniformly like a column, and the (111) orientation ratio of the PZT film becomes almost 100%. In this case, the (111) orientation ratio of the ferroelectric film 14 made of PZT, as shown in the first embodiment, is in excess of 90% and becomes almost 100% or close to this value.

If the crystal orientations are directed uniformly, the writing into the ferroelectric domain can be completed within a time of several tens nanoseconds that is required of the device to operate. However, if different crystal orientations are mixed, it takes much time to propagate the polarization inversion. Therefore, it may be considered that, since domains that cannot be inverted within the above time still remain, the imprint phenomenon is caused.

As a result, in order to operate the ferroelectric film as the device, 90% or more of the crystals must be oriented in the same direction.

(Third Embodiment)

In the first and second embodiments, the so-called planar capacitor in which the conductive plug is connected to the upper electrode and the lower electrode from the upper side respectively is explained. In the present embodiment, a semiconductor device having the so-called stacked capacitor in which the lower electrode of the capacitor is connected to the conductive plug from the lower side will be explained hereunder.

FIGS. 20A to 20K are sectional views showing steps of manufacturing a semiconductor device according to a third embodiment of the present invention.

Figure 20A:
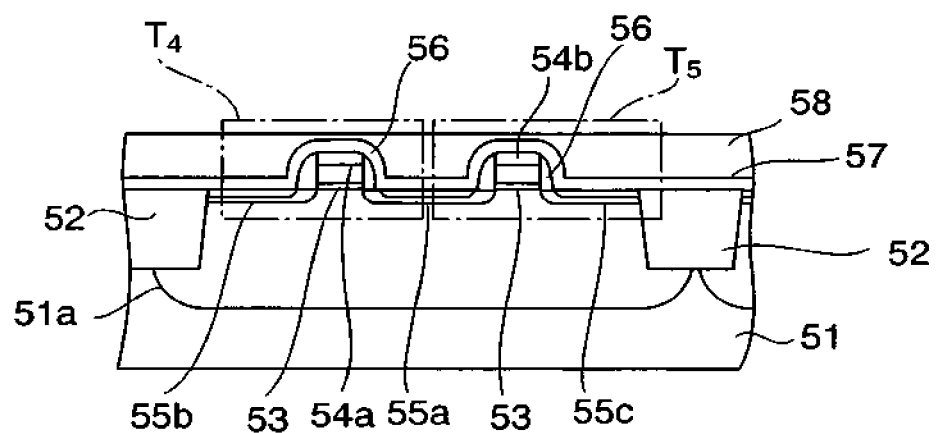
FIGS. 20A to 20K are sectional views showing steps of manufacturing a semiconductor device according to a third embodiment of the present invention.

Steps required until a sectional structure shown in FIG. 20A is formed will be explained hereunder.

First, an element isolation recess is formed around a transistor forming region of an n-type or p-type silicon (semiconductor) substrate 51 by the photolithography method. Then, an element-isolation insulating layer 52 is formed by burying silicon oxide (SiO$_2$) into the recess. The element-isolation insulating layer 52 having such a structure is called STI (Shallow Trench Isolation). In this case, an insulating layer that is formed by the LOCOS (Local Oxidation of Silicon) method may be employed as the element-isolation insulating layer.

Then, a p-type well 51a is formed by introducing selectively the p-type impurity into the transistor forming region of the silicon substrate 51 in the memory cell region.

Then, a silicon oxide layer serving as a gate insulating film 53 is formed by thermally oxidizing a surface of the p-type well 51a of the silicon substrate 51.

Then, an amorphous silicon or polysilicon layer and a tungsten silicide layer are formed sequentially on the overall upper surface of the silicon substrate 51. Then, gate electrodes 54a, 54b are formed on the p-type well 51a in the memory cell region by patterning the silicon layer and the tungsten silicide layer by virtue of the photolithography method. These gate electrodes 54a, 54b are formed on the silicon substrate 51 via the gate insulating film 53.

In this case, in the memory cell region, two gate electrodes 54a, 54b are formed in parallel on one p-type well 51a. These gate electrodes 54a, 54b constitute a part of the word line.

Then, the n-type impurity, e.g., phosphorus is ion-implanted into the p-type well 51a on both sides of the gate electrodes 54a, 54b. Thus, first to third n-type impurity diffusion regions 55a to 55c serving as the source/drain are formed.

Then, an insulating layer, e.g., a silicon oxide (SiO$_2$) layer is formed on the overall surface of the silicon substrate 51 by the CVD method. Then, insulating sidewall spacers 56 are left on both side portions of the gate electrodes 54a, 54b by etching back the insulating layer.

Then, the n-type impurity is ion-implanted again into the first to third n-type impurity diffusion regions 55a to 55c in the p-type well 51a by using the gate electrodes 54a, 54b and the sidewall spacers 56 as a mask. Thus, high impurity concentration regions are formed in the first to third n-type impurity diffusion regions 55a to 55c respectively.

In this case, in one p-type well 51a, the first n-type impurity diffusion region 55a formed between two gate electrodes 54a, 54b is connected electrically to the bit line, described later, whereas the second and third n-type impurity diffusion regions 55b, 55c formed near both ends of the p-type well 51a are connected electrically to the lower electrodes of the capacitors, described later.

According to above steps, in the p-type well 51a, two n-type MOS transistors $T_4$, $T_5$ including the gate electrodes 54a, 54b and the n-type impurity diffusion regions 55b, 55c having the LDD structure are formed to use one n-type impurity diffusion region 55a commonly.

Then, a silicon oxide nitride (SiON) layer of about 200 nm thickness is formed as a cover insulating film 57, which covers the MOS transistors $T_4$, $T_5$, on the overall surface of the silicon substrate 51 by the plasma CVD method. Then, a silicon oxide ($SiO_2$) layer of about 1.0 μm thickness is formed as a first interlayer insulating film 58 on the cover insulating film 57 by the plasma CVD method using the TEOS gas.

Then, the first interlayer insulating film 58 is annealed for 30 minute at the temperature of 700° C. in the atmospheric-pressure nitrogen atmosphere, for example. Thus, the first interlayer insulating film 58 is densified. Then, an upper surface of the first interlayer insulating film 58 is planarized by the CMP (Chemical Mechanical Polishing) method.

Figure 20B:
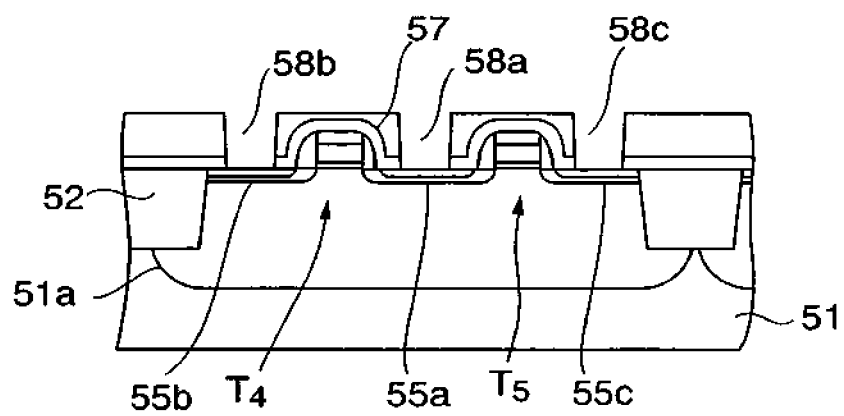

Then, as shown in FIG. 20B, the first interlayer insulating film 58 and the cover insulating film 57 are etched by using a resist pattern (not shown). Thus, first, second, and third contact holes 58a, 58b, 58c are formed on the first, second, and third n-type impurity diffusion regions 55a, 55b, 55c in the memory cell region respectively.

Figure 20C:
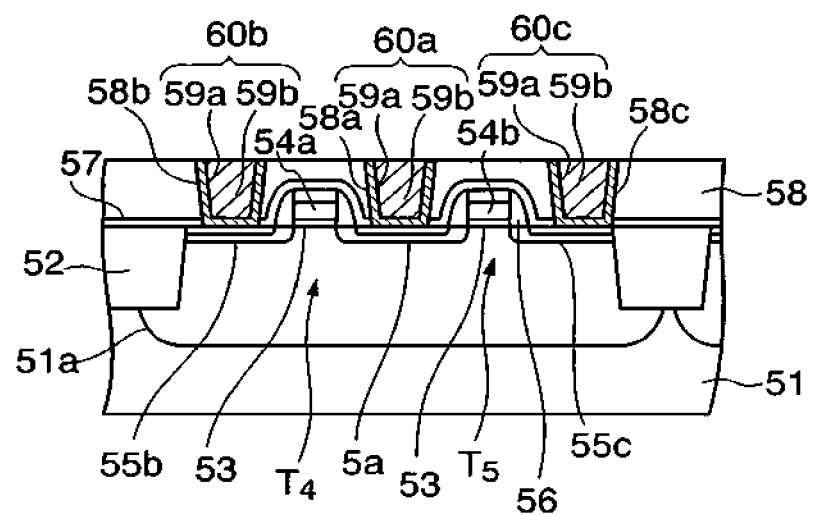

Next, steps required until a structure shown in FIG. 20C is formed will be explained hereunder.

First, a titanium (Ti) layer of 20 nm thickness and a titanium nitride (TiN) layer of 50 nm thickness are formed sequentially as a glue layer 59a on an upper surface of the first interlayer insulating film 58 and inner surfaces of the first to third contact holes 58a to 58c by the sputter method. Then, a tungsten (W) layer 59b is grown on the glue layer 59a by the CVD method using $WF_6$ so as to bury perfectly insides of the first to third contact holes 58a to 58c.

Then, the tungsten layer 59b and the glue layer 59a are polished by the CMP method to remove from the upper surface of the first interlayer insulating film 58. Thus, the tungsten layer 59b and the glue layer 59a that are left in the first, second, and third contact holes 58a, 58b, 58c respectively are used as first, second, and third conductive plugs 60a, 60b, 60c. The first, second, and third conductive plugs 60a, 60b, 60c are connected to the first, second, and third n-type impurity diffusion regions 55a, 55b, 55c respectively. Also, the first conductive plug 60a is connected electrically to the bit line, described later, while the second and third conductive plugs 60b, 60c are connected electrically to the capacitors, described later, respectively.

Then, the first interlayer insulating film 58 is exposed to the nitrogen plasma atmosphere at the substrate temperature of 350° C. for 120 second.

Figure 20D:
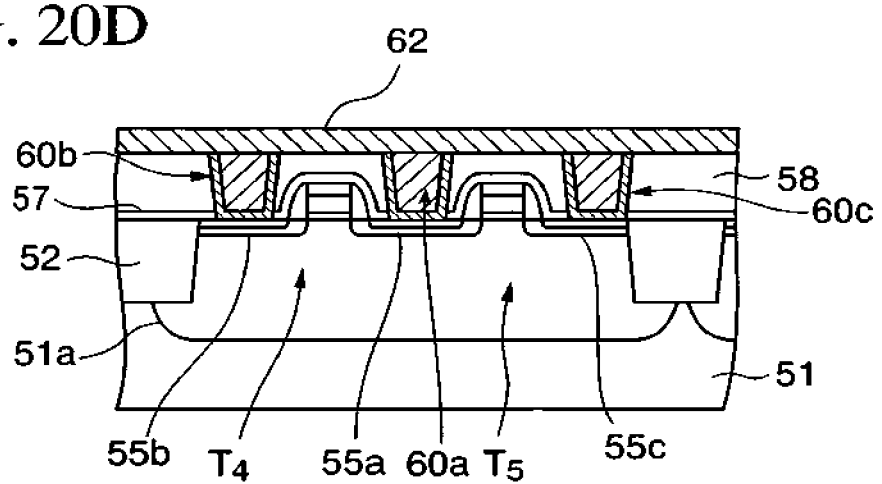

Then, as shown in FIG. 20D, an iridium layer is formed as a conductive oxygen barrier metal layer 62 on the first to third conductive plugs 60a to 60c and the first interlayer insulating film 58 by the sputter. The iridium layer is formed to have a thickness enough to prevent the abnormal oxidation of the second and third conductive plugs 60b, 60c. For example, in order to prevent the abnormal oxidation of the conductive plugs 60a to 60c caused when the annealing is executed at the substrate temperature of 550° C. in the oxygen-containing atmosphere, the iridium layer is formed to have a thickness of 200 to 400 nm.

In this case, a Ti film may be formed between the oxygen barrier metal layer 62 and a first insulating adhesive layer 61.

Then, a resist pattern is formed on the oxygen barrier metal layer 62 over the second and third conductive plugs 60b, 60c and their peripheral areas as a mask.

Figure 20E:
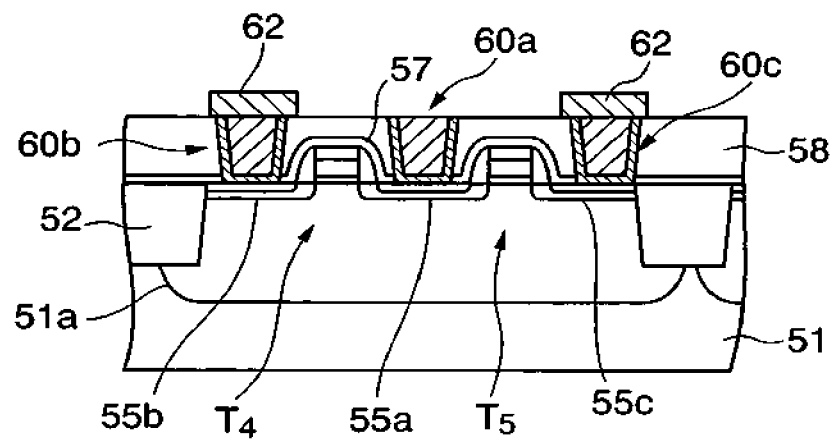

Then, as shown in FIG. 20E, the oxygen barrier metal layer 62 is left like an island on the second and third conductive plugs 60b, 60c and their peripheral areas by etching the oxygen barrier metal layer 62 in the region that is not covered with the mask. Thus, the first conductive plug 60a is exposed. Then, the mask is removed. In this case, a hard mask made of titanium nitride, silicon oxide, or the like may be used as the mask.

Figure 20F:
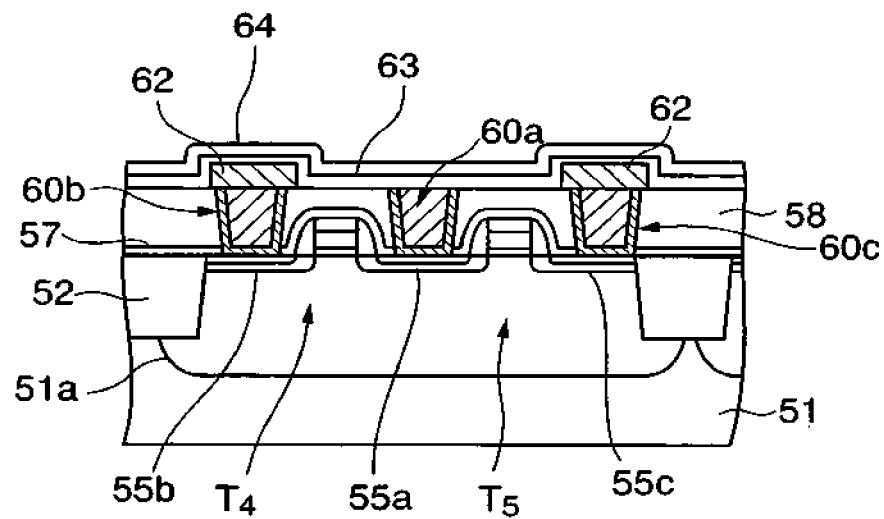

Then, as shown in FIG. 20F, a silicon oxide nitride (SiON) layer or a silicon nitride ($Si_3N_4$) layer of 100 nm thickness, for example, is formed as an oxidation-preventing insulating film 63 on the first conductive plug 60a, the oxygen barrier metal layer 62, and the first interlayer insulating film 58 by the CVD method. The SiON layer or the $Si_3N_4$ layer having a 100 nm thickness has the capability that can prevent the oxidation of the first conductive plug 60a in the oxygen annealing at about 650° C.

Then, an insulating adhesive layer 64 is formed on the oxidation-preventing insulating film 63. This insulating adhesive layer 64 is formed not only to improve the adhesiveness to the capacitor lower electrode, described later, but also to enhance the (111) orientation intensity of the iridium film or the platinum film constituting the capacitor lower electrode, as explained in the first and second embodiments.

An alumina layer of 10 nm thickness, for example, is formed as the insulating adhesive layer 64. The alumina layer forming conditions are set identically to the forming conditions of the adhesive layer 12 made of alumina, as shown in the first and second embodiments, for example.

Figure 20G:
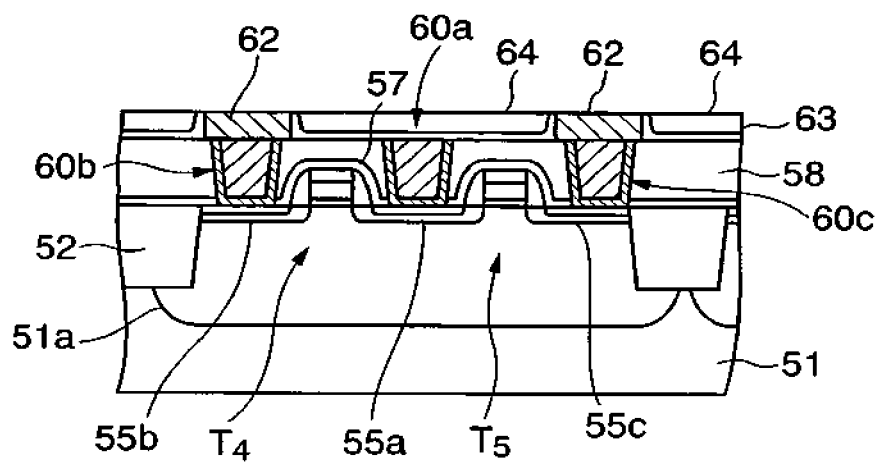

Then, as shown in FIG. 20G, while causing the oxygen barrier metal layer 62 to function as the stopper layer, the insulating adhesive layer 64 and the oxidation-preventing insulating film 63 are polished by the CMP method to expose an upper surface of the oxygen barrier metal layer 62. In this case, polished surfaces of the oxygen barrier metal layer 62, the insulating adhesive layer 64, and the oxidation-preventing insulating film 63 are made flat.

The CMP conditions are set in such a way that the surface roughness of the insulating adhesive layer 64 is set smaller than 0.79 nm or less.

Figure 20H:
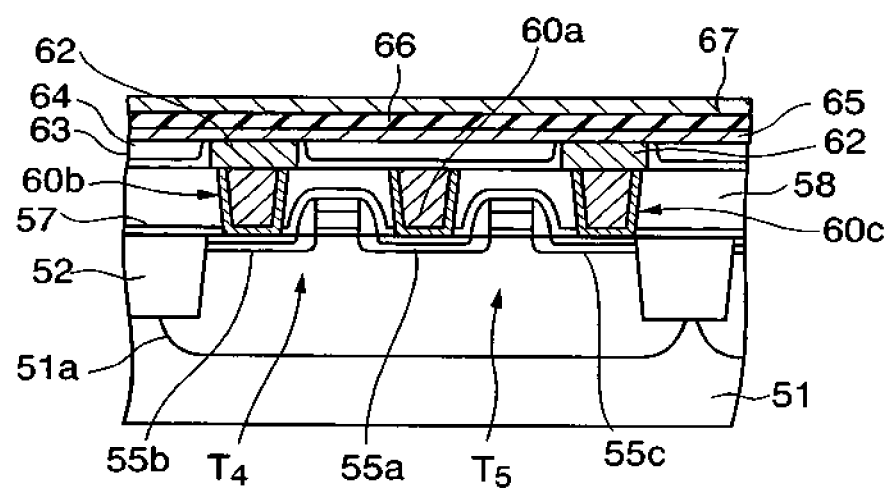

Then, as shown in FIG. 20H, a first conductive layer 65 is formed on the oxygen barrier metal layer 62, the oxidation-preventing insulating film 63, and the insulating adhesive layer 64. As the first conductive layer 65, a titanium (Ti) layer of 10 nm thickness and an iridium layer of 150 nm thickness, for example, are formed sequentially by the sputter.

In this case, in order to prevent the peeling-off of the film, for example, the insulating adhesive layer 64 may be annealed before or after the first conductive layer 65 is formed. As the annealing method, for example, the RTA executed at 750° C. for 60 second in the argon atmosphere is employed.

Then, a PZT layer of 200 nm thickness, for example, is formed as a ferroelectric layer 66 on the first conductive layer 65 by the MOCVD method.

The forming conditions of the PZT layer by the MOCVD method are set equally to the forming conditions of the PZT layer constituting the ferroelectric film 14 in the second embodiment, for example.

In this case, like the first embodiment, the sputter, the sol-gel method, the COD method, or the like may also be employed to form the PZT layer.

Also, as the material of the ferroelectric layer 66, other PZT material such as PLCSZT, PLZT, or the like, the Bi-layered structure compound material such as $SrBi_2Ta_2O_9$, $SrBi_2(Ta$, $Nb)_2O_9$, or the like, and other metal oxide ferroelectric substance may be employed in addition to PZT. In this case, like the first embodiment, the material that contains Ir atoms in the $ABO_3$ perovskite structure may be employed as the metal oxide ferroelectric substance.

Here, the annealing to crystallize the ferroelectric substance is not executed after the ferroelectric layer 66 is formed by the MOCVD method.

Then, an iridium oxide ($IrO_2$) film of 200 nm thickness, for example, is formed as a second conductive layer 67 on the ferroelectric layer 66 by the sputter method.

Then, a TiN layer and an $SiO_2$ layer are formed sequentially as a hard mask (not shown) on the second conductive layer 67. The TiN layer is formed by the sputter, and the $SiO_2$ layer is formed by the CVD method using TEOS. The hard mask is patterned by the photolithography method to form a capacitor planar shape over the oxygen barrier metal layers 62 and their peripheries on the second and third conductive plugs 60b, 60c respectively.

Then, the second conductive layer 67, the ferroelectric layer 66, and the first conductive layer 65 located in areas, which are not covered with the hard mask, are etched sequentially. Thus, capacitors $Q_1$ are formed on the oxygen barrier metal layers 62, the insulating adhesive layer 64, and the oxidation-preventing insulating film 63. In this case, the second conductive layer 67, the ferroelectric layer 66, and the first conductive layer 65 are etched by the sputter reaction in the atmosphere containing the halogen element.

Figure 20I:
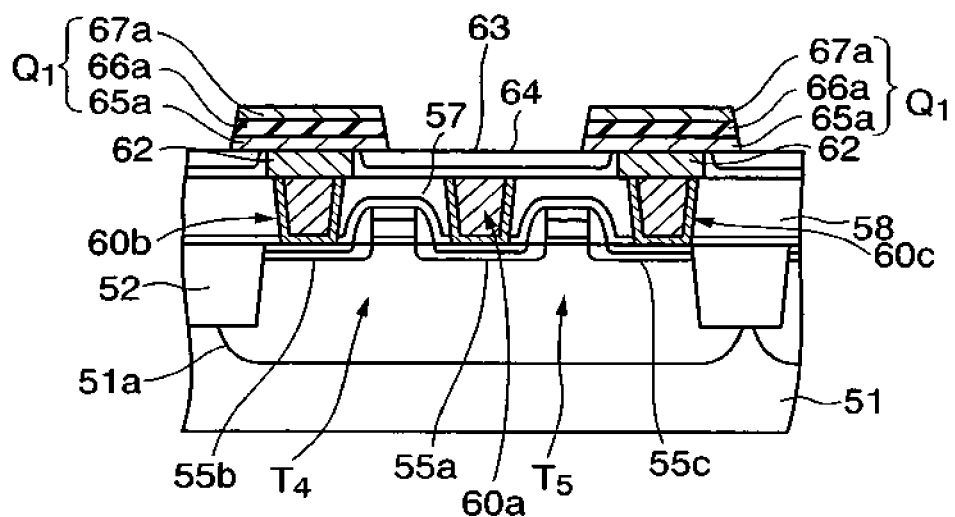

Then, as shown in FIG. 20I, the capacitor $Q_1$ consists of a lower electrode 65a made of the first conductive layer 65, a dielectric layer 66a made of the ferroelectric layer 66, and an upper electrode 67a made of the second conductive layer 67.

Two capacitors $Q_1$ are formed over one p-type well 51a. The lower electrodes 65a of these capacitors are connected electrically to the second or third n-type impurity diffusion region 55b, 55c via the second or third conductive plug 60b, 60c respectively.

The hard masks are removed after the patterns of the capacitors $Q_1$ are formed.

Then, in order to recover the film quality of the ferroelectric layer 66 from the damage caused by the etching, the recovery annealing of the capacitor is carried out. The recovery annealing in this case is executed in the furnace containing the oxygen at the substrate temperature of 650 Žfor 60 minute, for example.

In this manner, when the heat treatment such as the recovery annealing, or the like is applied immediately after the patterning of the ferroelectric layer 66, the heat resistance of the second and third conductive plugs 60b, 60c formed directly under the lower electrodes 65a is decided by the oxygen permeability of the oxygen barrier metal layer 62, and also the oxidation resistance of the first conductive plug 60a that is not positioned directly under the lower electrode 65a is decided by the oxygen permeability of the insulating adhesive layer 64 and the oxidation-preventing insulating film 63.

The above thermal processes are needed to form the capacitors $Q_1$. However, when the silicon nitride layer is employed as the oxidation-preventing insulating film 63, the first conductive plug 60a made of tungsten is not abnormally oxidized if a thickness of the silicon nitride layer is set to 70 nm.

Figure 20J:
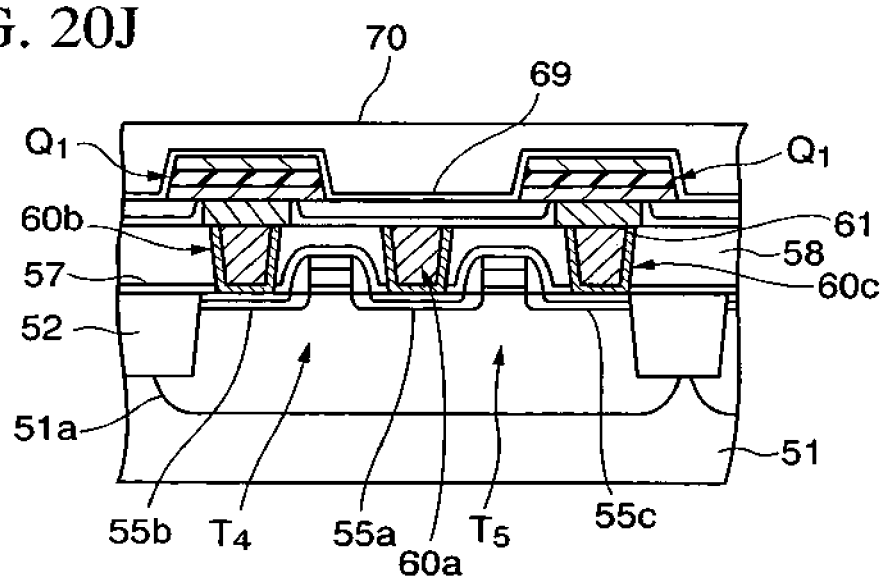

Then, as shown in FIG. 20J, an alumina film of 50 nm thickness is formed as a capacitor protection layer 69 on the capacitors $Q_1$ and the insulating adhesive layer 64 by the sputter. This capacitor protection layer 69 protects the capacitors $Q_1$ from the process damage, and may be formed of PZT in addition to the alumina.

Then, the capacitors $Q_1$ are annealed at 650° C. for 60 minute in the oxygen atmosphere in the furnace.

Then, a silicon oxide ($SiO_2$) film of about 1.0µ thickness is formed as a second interlayer insulating film 70 on the capacitor protection layer 69 by the plasma CVD method by using the HDP (High Density Plasma) equipment.

Then, an upper surface of the second interlayer insulating film 70 is planarized by the CMP method. In this example, a remaining thickness of the second interlayer insulating film 70 after the CMP is set to about 300 nm on the upper electrode 67a.

Figure 20K:
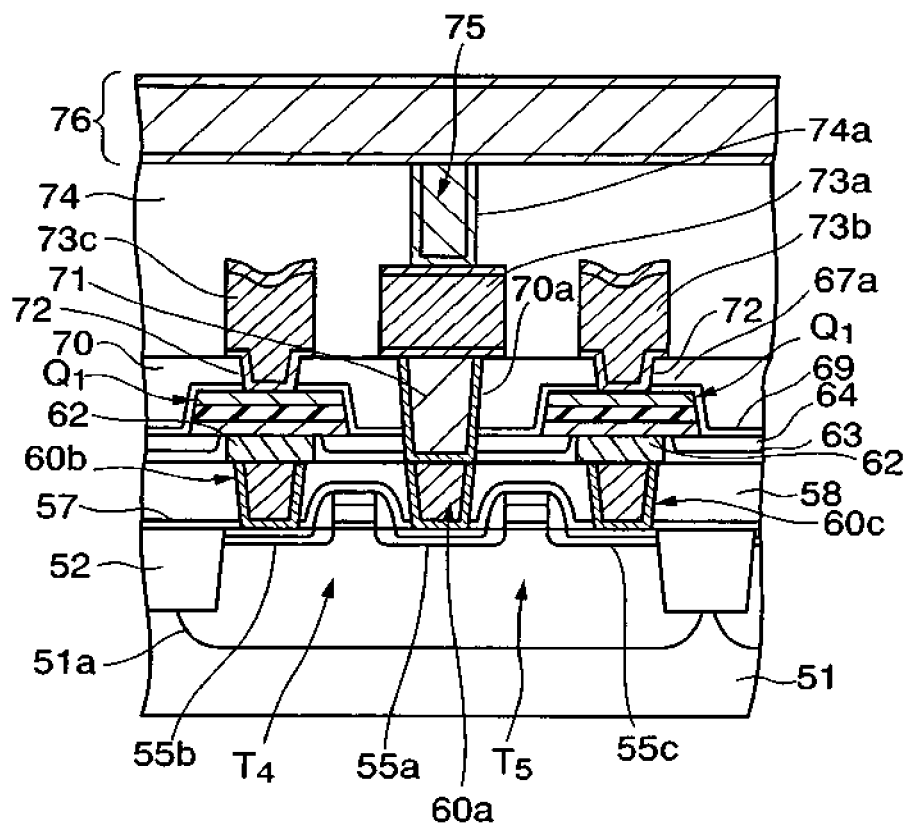

Next, steps required until a structure shown in FIG. 20K is formed will be explained hereunder.

First, the second interlayer insulating film 70, the capacitor protection layer 69, the insulating adhesive layer 64, and the oxidation-preventing insulating film 63 are etched by using a resist mask (not shown). Thus, a fourth contact hole 70a is formed on the first conductive plug 60a.

Then, a TiN layer of 50 nm thickness is formed as a glue layer on an inner surface of the fourth contact hole 70a and on the second interlayer insulating film 70 by the sputter method. Then, a tungsten layer is grown on the glue layer by the CVD method to bury completely the fourth contact hole 70a.

Then, the tungsten layer and the glue layer are polished by the CMP method to remove from an upper surface of the second interlayer insulating film 70. Thus, the tungsten layer and the glue layer being left in the fourth contact hole 70a are used as a fourth conductive plug 71.

Hence, the fourth conductive plug 71 is connected to the first conductive plug 60a to constitute a via-to-via contact, and then is connected electrically to the first n-type impurity diffusion region 55a.

Then, the second interlayer insulating film 70 is annealed at 350° C. for 120 second in the nitrogen plasma atmosphere.

Then, an SiON layer of 100 nm thickness is formed as a second oxidation preventing layer (not shown) on the fourth conductive plug 71 and on the second interlayer insulating film 70 by the CVD method.

Then, the second oxidation preventing layer, the second interlayer insulating film 70, and the capacitor protection layer 69 are patterned by the photolithography method. Thus, holes 72 are formed on the upper electrodes 67 of the capacitors $Q_1$. The capacitors $Q_1$ that are subjected to the damage in forming the holes 72 are recovered by the annealing. This annealing is carried out at the substrate temperature of 550 Žfor 60 minute in the oxygen-containing atmosphere, for example.

Then, the second oxidation preventing layer formed on the second interlayer insulating film 70 is removed by the etching-back. Thus, a surface of the fourth conductive plug 71 is exposed.

Then, a multi-layered metal layer is formed in the holes 72, which are positioned on the upper electrodes 67a of the capacitors $Q_1$, and the second interlayer insulating film 70. As the multi-layered metal layer, a Ti layer of 60 nm thickness, a TiN layer of 30 nm thickness, an Al—Cu layer of 400 nm thickness, a Ti layer of 5 nm thickness, and a TiN layer of 70 nm thickness, for example, are formed sequentially.

Then, a conductive pad 73a, which is connected to the fourth conductive plug 71, and first-layer metal wirings 73b, 73c, which are connected to the upper electrodes 67a via the holes 72, are formed by patterning the multi-layered metal layer.

Then, a third interlayer insulating layer 74 is formed on the second interlayer insulating film 70, the first-layer metal wirings 73b, 73c, and the conductive pad 73a. Then, a bit-line contact hole 74a is formed on the conductive pad 73a by patterning the third interlayer insulating layer 74. Then, a fifth conductive plug 75 that consists of a TiN layer and a W layer in order from the bottom is formed in the contact hole 74a.

Then, a second-layer metal wiring containing a bit line 76 is formed on the third interlayer insulating layer 74. The bit line 76 has a multi-layered metal structure, like the first-layer metal wirings 73b, 73c.

Then, an insulating layer for covering the second-layer metal wiring, etc. are formed. Lastly a cover insulating layer consisting of silicon oxide layer using the TEOS material and a silicon nitride layer is formed. But their details are omitted herein.

In the FeRAM memory cell formed by above steps, the insulating adhesive layer 64 with the good flatness is present under a part of the lower electrode 65a. Thus, like the second embodiment, the (111) orientation intensity of the first conductive film 65 (lower electrode 65a) is enhanced. Therefore, when the PZT ferroelectric layer 66 is formed on the first conductive film 65 at the high substrate temperature of 620° C. by the MOCVD method, 90% or more of the grains constituting the ferroelectric layer 66 are directed in the (111) orientation. As a result, like the second embodiment, the imprint characteristic of the memory cell in the present embodiment was improved.

In addition, when the ferroelectric layer 66 is formed by the MOCVD method, the conductive plugs 60b, 60c made of tungsten are covered with the oxygen barrier metal layer 62, and therefore the abnormal oxidation of the conductive plugs 60b, 60c is not generated.

However, when the growth temperature of the ferroelectric layer 66 is set too high, the conductive plugs 60b, 60c are ready to be oxidized. Therefore, it is preferable that, in order to prevent the oxidation of the conductive plugs 60b, 60c, the growth temperature is set to 650° C. or less. Also, in order to attain 90% or more of the (111) orientation ratio of the grains in the PZT film, the growth temperature of 600° C. or more is needed.

From the above facts, in the steps of forming the capacitor $Q_1$ having the stacked structure in which the conductive plugs 60b, 60c are connected to the lower electrodes 65a, it is preferable to form the ferroelectric layer 66 at the growth temperature of 600 to 650° C.

(Fourth Embodiment)

In the present embodiment, such a structure will be explained hereunder that the iridium film formed as the oxygen barrier metal layer 62 constitutes a part of the lower electrode 65a of the capacitor Q.

FIGS. 21A to 21I are sectional views showing steps of manufacturing a semiconductor device according to a fourth embodiment of the present invention.

First, the MOS transistors $T_4$, $T_5$ are formed the silicon substrate 51 by the steps shown in the third embodiment. Then, the cover insulating layer 57 and the first interlayer insulating layer 58 are formed.

Figure 21A:
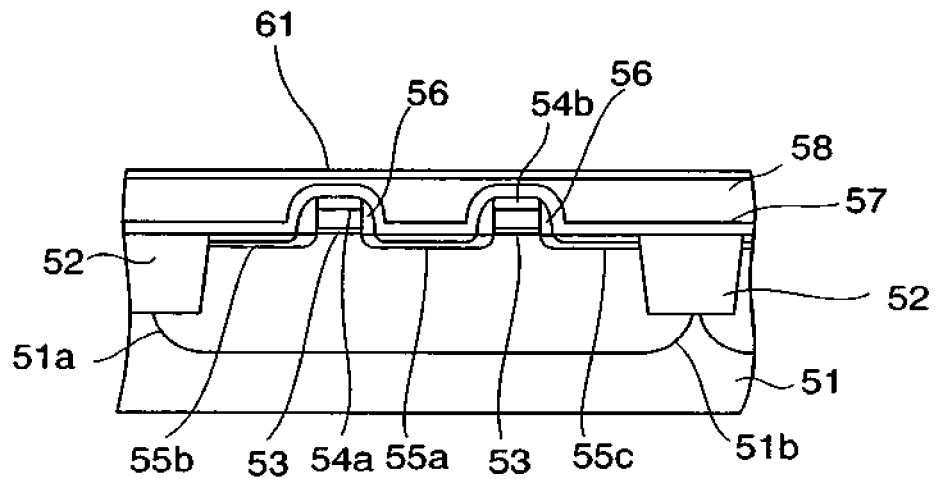
FIGS. 21A to 21I are sectional views showing steps of manufacturing a semiconductor device according to a fourth embodiment of the present invention.

Then, as shown in FIG. 21A, a first insulating adhesive layer 61 whose surface roughness is 0.79 nm or less is formed on the first interlayer insulating film 58. The first insulating adhesive layer 61 is formed not only to improve the adhesiveness to the capacitor lower electrode, described later, but also to improve the (111) orientation characteristic of the iridium film or the platinum film constituting the capacitor lower electrode, as explained in the first and second embodiments.

As the first insulating adhesive layer 61, an alumina layer of 10 nm thickness, for example, is formed. The forming conditions of the alumina layer are set equally to the forming conditions of the adhesive layer 12 made of alumina shown in the first and second embodiments, for example.

Figure 21B:
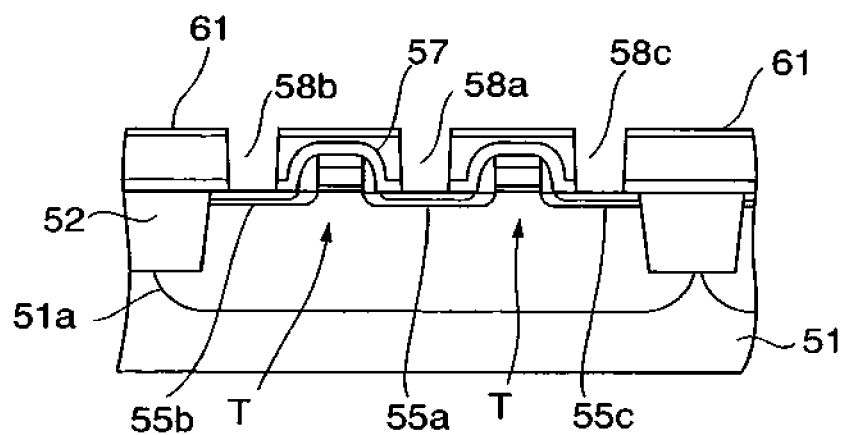

Then, as shown in FIG. 21B, the first insulating adhesive layer 61, the first interlayer insulating film 58, and the cover insulating layer 57 are patterned. Thus, the first, second, and third contact holes 58a, 58b, 58c are formed on the first, second, and third n-type impurity diffusion regions 55a, 55b, 55c in the memory cell region respectively.

Figure 21C:
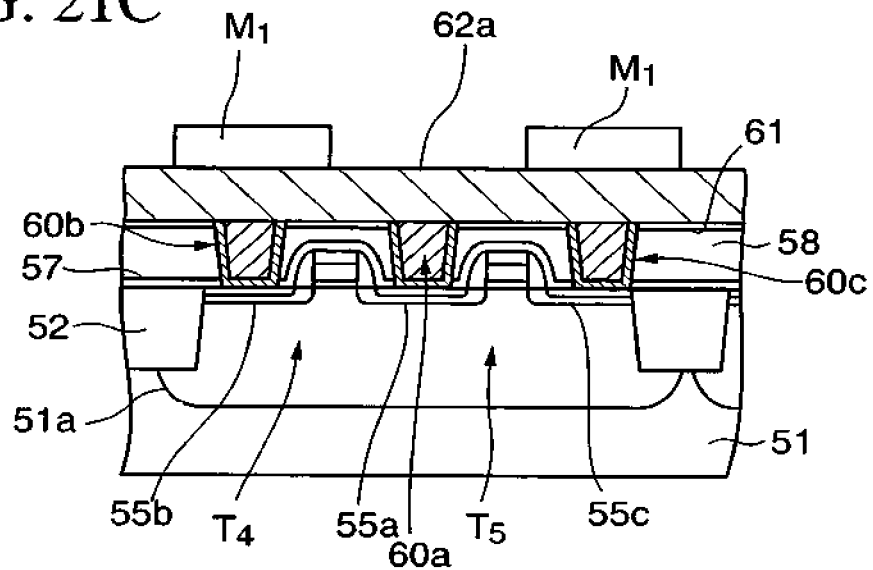

Next, steps required until a structure shown in FIG. 21C is formed will be explained hereunder.

First, according to the same steps as the third embodiment, the first, second, and third conductive plugs 60a, 60b, 60c are formed in the first, second, and third contact holes 58a, 58b, 58c respectively. The first, second, and third conductive plugs 60a, 60b, 60c are constructed by the laminated structure that consists of the tungsten layer 59b and the glue layer 59a.

Then, an iridium layer is formed as a conductive oxygen barrier metal layer 62a on the first to third conductive plugs 60a to 60c and the first insulating adhesive layer 61 by the sputter. This oxygen barrier metal layer 62a constitutes the lower electrode of the capacitor Q, as described later.

In this case, a Ti film may be formed between the oxygen barrier metal layer 62a and the first insulating adhesive layer 61.

The iridium layer acting as the oxygen barrier metal layer 62a is formed to have a thickness enough to prevent the abnormal oxidation of the conductive plugs 60a to 60c. For example, the iridium layer is formed to have a thickness of 200 nm to prevent the abnormal oxidation of the conductive plugs 60a to 60c when the annealing is executed at the substrate temperature of 550° C. in the oxygen-containing atmosphere, and the thickness is increased by 100 nm every time when the substrate temperature is increased by 100° C. In other words, if the iridium layer has a thickness of 400 nm, such iridium layer can prevent the oxidation of the conductive plugs 60a to 60c at the oxygen annealing of 750° C.

Then, masks $M_1$ are formed on the oxygen barrier metal layer 62a over the second and third conductive plugs 60b, 60c and their peripheral areas. A planar shape of the mask $M_1$ is set to a shape of the lower electrode of the capacitor, described later. As the mask $M_1$, the resist may be employed, or the hard mask made of titanium nitride, silicon oxide, or the like may be employed.

Figure 21D:
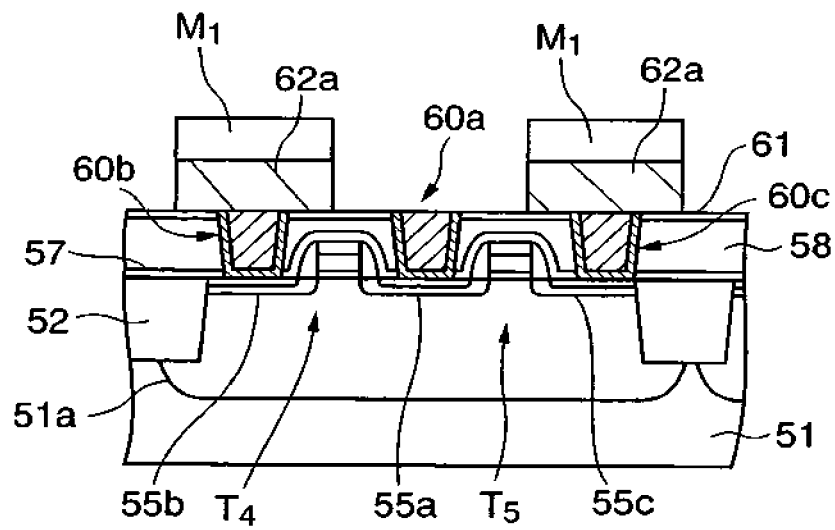

Then, as shown in FIG. 21D, the oxygen barrier metal layer 62a in areas that are not covered with the masks $M_1$ is etched in such a manner that the oxygen barrier metal layer 62a is left on the first insulating adhesive layer 61 over the second and third conductive plugs 60b, 60c and their peripheral areas to have a size of the capacitor respectively. As the etching gas of the oxygen barrier metal layer 62a, the halogen-based gas is employed. The first conductive plug 60a is exposed.

Then, the masks $M_1$ are removed.

Figure 21E:
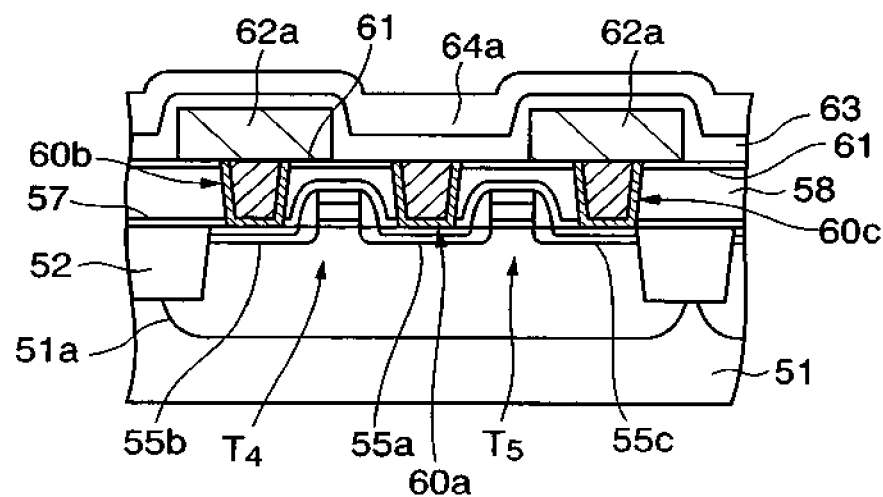

Then, as shown in FIG. 21E, the silicon oxide nitride (SiON) layer or the silicon nitride ($Si_3N_4$) layer of 100 nm thickness, for example, is formed as the oxidation-preventing insulating film 63 on the first conductive plug 60a, the oxygen barrier metal layer 62a, and the first insulating adhesive layer 61 by the CVD method. Then, a silicon oxide ($SiO_2$) layer of 300 nm thickness, for example, is formed as a second insulating adhesive layer 64a on the oxidation-preventing insulating film 63 by the CVD method using TEOS, for example.

Figure 21F:
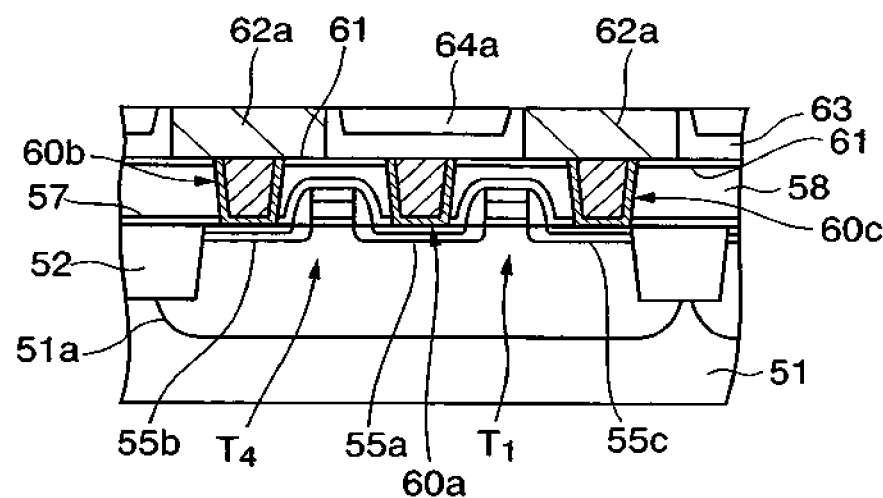

Then, as shown in FIG. 21F, while making the oxygen barrier metal layer 62a function as the stopper layer, the second insulating adhesive layer 64a and the oxidation-preventing insulating film 63 are polished by the CMP. Thus, an upper surface of the oxygen barrier metal layer 62a is exposed. In this case, upper surfaces of the oxygen barrier metal layer 62a, the second insulating adhesive layer 64a, and the oxidation-preventing insulating film 63 are planarized by the CMP.

Figure 21G:
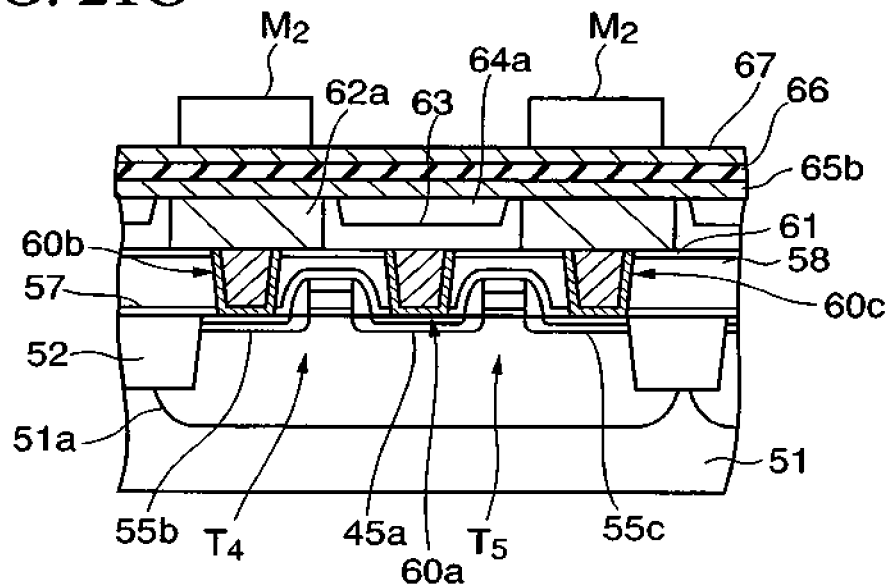

Then, as shown in FIG. 21G, an Ir layer of 30 nm thickness, for example, is formed as a first conductive layer 65b on the oxygen barrier metal layer 62a, the oxidation-preventing insulating film 63, and the second insulating adhesive layer 64a by the sputter. This Ir layer takes over the orientation of the oxygen barrier metal layer 62a and has the enhanced (111) orientation intensity.

In this case, in order to prevent the peeling-off of the film, for example, the second insulating adhesive layer 64a may be annealed before or after the first conductive layer 65b is formed. As the annealing method, for example, the RTA executed at 750° C. for 60 second in the argon atmosphere is employed.

Then, the PZT layer of 120 nm thickness, for example, is formed as the ferroelectric layer 66 on the first conductive layer 65b by the MOCVD method. The forming conditions of the ferroelectric layer 66 by the MOCVD method are set equally to those in the third embodiment.

In this case, as the forming method of the ferroelectric layer 66, other method shown in the third embodiment may be employed. Also, as the material of the ferroelectric layer 66, materials shown in the third embodiment may be employed in addition to PZT.

Then, an $IrO_2$ layer of 200 nm thickness, for example, is formed as the second conductive layer 67 on the ferroelectric layer 66 by the sputter method.

Then, a TiN layer and an $SiO_2$ layer are formed sequentially on the second conductive layer 67. The TiN layer is formed by the sputter, and the $SiO_2$ layer is formed by the CVD method using TEOS. The TiN layer and the $SiO_2$ layer are patterned into the almost same planar shape as the oxygen barrier metal layer 62a over the second and third conductive plugs 60b, 60c to constitute hard masks $M_2$.

Then, the second conductive layer 67, the ferroelectric layer 66, and the first conductive layer 65b are etched sequentially. In this case, if the insulating adhesive layer 64 is etched by this etching, the oxidation-preventing insulating film 63 functions as the etching stopper and thus the first conductive plug 60a is never exposed.

Figure 21H:
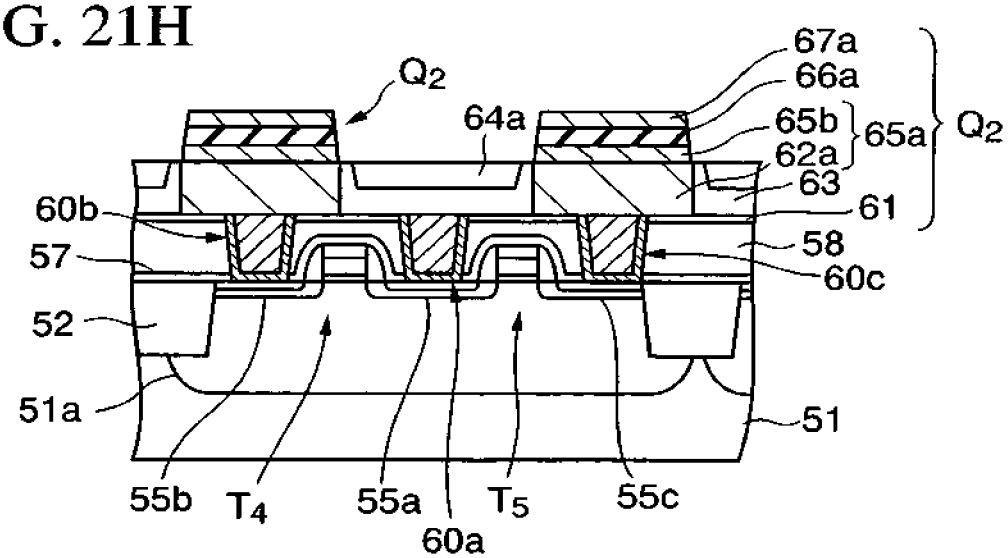

With the above, as shown in FIG. 21H, capacitors $Q_2$ are formed on the first interlayer insulating film 58. A lower electrode 65a of the capacitor $Q_2$ consists of the first conductive layer 65b and the oxygen barrier metal layer 62a. Also, a dielectric layer 66a of the capacitor $Q_2$ consists of the ferroelectric layer 66, and also an upper electrode 67a of the capacitor $Q_2$ consists of the second conductive layer 67.

Two capacitors $Q_2$ are arranged over one p-type well 51a. Their lower electrodes are connected electrically to the second or third n-type impurity diffusion region 55b, 55c via the second or third conductive plug 60b, 60c respectively.

The hard masks $M_2$ are removed after the patterns of the capacitors $Q_2$ are formed.

Then, in order to recover the film quality of the ferroelectric layer 66 from the damage caused by the etching, the recovery annealing is applied to the capacitors $Q_2$. This recovery annealing in this case is carried out at the substrate temperature of 650 Ž for 60 second in the furnace containing the oxygen, for example.

In this manner, when the heat treatment such as the recovery annealing, or the like is applied immediately after the patterning of the ferroelectric layer 66, the heat resistance of the second and third conductive plugs 60b, 60c formed directly under the lower electrodes 65a is decided by the oxygen permeability of the oxygen barrier metal layer 62a, and also the oxidation resistance of the first conductive plug 60a that is not positioned directly under the lower electrode 65a is decided by the oxygen permeability of the second insulating adhesive layer 64a and the oxidation-preventing insulating film 63.

Figure 21I:
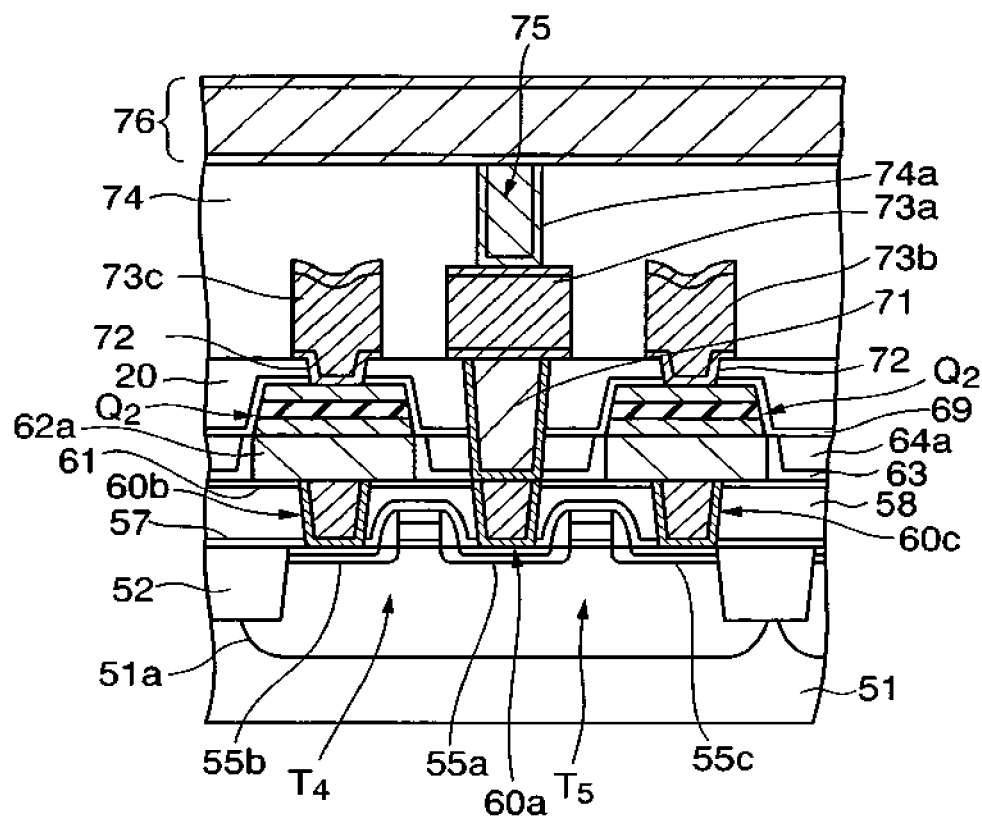

Next, steps required until a structure shown in FIG. 21I is formed will be explained hereunder.

First, an alumina layer of 50 nm thickness is formed as the capacitor protection layer 69 on the capacitors $Q_2$, the oxidation-preventing insulating film 64, and the second insulating adhesive layer 64a by the sputter. Then, in compliance with the steps explained in the third embodiment, the fourth conductive plug 71, the conductive pad 73a, the first-layer metal wirings 73b, 73c, the third interlayer insulating layer 74, the fifth conductive plug 75, the bit line, etc. are formed.

In the FeRAM memory cell formed according to above steps, the first insulating adhesive layer 61 with the good flatness is present under the oxygen barrier metal layer 62a constituting a part of the lower electrode 65a.

Thus, like the third embodiment, the (111) orientation intensity of the first conductive film 65 (lower electrode 65a) is enhanced. Therefore, when the PZT ferroelectric layer 66 is formed on the first conductive film 65 at the high substrate temperature of 620° C. by the MOCVD method, 90% or more of the grains constituting the ferroelectric layer 66 are directed in the (111) orientation. As a result, like the second embodiment, the imprint characteristic of the memory cell was improved.

In addition, when the ferroelectric layer 66 is formed by the MOCVD method, the conductive plugs 60b, 60c made of tungsten are covered with the oxygen barrier metal layer 62, and therefore the abnormal oxidation of the conductive plugs 60b, 60c is not generated.

In this case, in the forming steps of the capacitors $Q_2$, like the third embodiment, it is preferable that the ferroelectric layer 66 should be formed at the growth temperature of 600 to 650° C.

As described above, according to the present invention, the capacitor including the ferroelectric layer having the $ABO_3$ perovskite structure having Ir in at least one of the A site and the B site is provided. Therefore, the residual polarization characteristic can be increased rather than the capacitor including the ferroelectric layer that does not have Ir in the $ABO_3$ perovskite structure.

Also, the capacitor lower electrode, the (111) orientation of which is inclined from the perpendicular direction of the substrate surface by 2.3° or less, is formed on the adhesive layer whose surface roughness is smaller than 0.79 nm or less. Therefore, the (111) orientation of the ferroelectric layer formed on the lower electrode can be improved.

In addition, the (111) orientation of the ferroelectric layer formed on the lower electrode of the capacitor is inclined from the perpendicular direction of the substrate surface by 3.5° or less. Therefore, the number of failure bit of the FeRAM having such capacitor can be reduced smaller than the prior art.

Further, the lower electrode made of iridium or iridium-containing material is formed on the adhesive layer whose surface roughness is smaller than 0.79 nm or less, and then the ferroelectric layer is formed thereon by the MOCVD method. Therefore, it is possible to form the ferroelectric layer that contains the grains having the (111) orientation by 90% or more.

What is claimed is:

1. A manufacturing method of a semiconductor device comprising forming an insulating film over a semiconductor substrate;

forming an adhesive layer made of alumina on the insulating film;

forming a first conductive film on the adhesive layer;

forming a ferroelectric layer, which includes an $ABO_3$ perovskite structure that contains an Ir element in at least one of an A site and a B site (A=any one of Bi, Pb, Ba, Sr, Ca, Na, K, and a rare earth element, B=any of Ti, Zr, Nb, Ta, W, Mn, Fe, Co, and Cr), on the first conductive film;

forming a second conductive film on the ferroelectric layer;

forming a capacitor upper electrode by patterning the second conductive film;

leaving the ferroelectric layer at least under the upper electrode by patterning the ferroelectric layer; and forming a capacitor lower electrode below the upper electrode by patterning the first conductive film.

2. The manufacturing method of a semiconductor device according to claim 1, wherein the ferroelectric layer is formed by any one of a MOCVD using an organic source containing Ir, a sputter using a target containing Ir, and a spin-on method using a sol-gel solution having the Ir element or an MOD solution having Ir.

3. The manufacturing method of a semiconductor device according to claim 1, wherein forming the ferroelectric layer includes, forming a ferroelectric material layer, forming the second conductive film, which is made of any one of iridium and iridium-containing material, on the ferroelectric material layer, and doping Ir from the second conductive film into the ferroelectric material layer by heat.

* * * * *